(12) United States Patent
Zainuddin et al.

(10) Patent No.: US 11,205,493 B1
(45) Date of Patent: Dec. 21, 2021

(54) CONTROLLING WORD LINE VOLTAGES TO REDUCE READ DISTURB IN A MEMORY DEVICE

(71) Applicant: SanDisk Technologies LLC, Addison, TX (US)

(72) Inventors: Abu Naser Zainuddin, Milpitas, CA (US); Henry Chin, Fremont, CA (US); Jiahui Yuan, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/080,628

(22) Filed: Oct. 26, 2020

(51) Int. Cl.

| | | |
|---|---|---|
| *G11C 16/04* | (2006.01) | |
| *G11C 16/34* | (2006.01) | |
| *G11C 16/08* | (2006.01) | |
| *G11C 11/56* | (2006.01) | |
| *G11C 16/26* | (2006.01) | |
| *H01L 27/11582* | (2017.01) | |
| *H01L 27/11556* | (2017.01) | |

(52) U.S. Cl.
CPC ...... *G11C 16/3427* (2013.01); *G11C 11/5642* (2013.01); *G11C 11/5671* (2013.01); *G11C 16/0483* (2013.01); *G11C 16/08* (2013.01); *G11C 16/26* (2013.01); *H01L 27/11556* (2013.01); *H01L 27/11582* (2013.01)

(58) Field of Classification Search
CPC .................................................. G11C 16/0483
USPC ..................................................... 365/185.17
See application file for complete search history.

(56) References Cited

U.S. PATENT DOCUMENTS

| | | | |
|---|---|---|---|
| 8,520,441 | B2 | 8/2013 | Yuh |
| 8,670,285 | B2 | 3/2014 | Dong et al. |
| 9,361,993 | B1 | 6/2016 | Chen et al. |
| 9,589,660 | B1 * | 3/2017 | Hashimoto ....... H01L 27/11582 |
| 10,008,271 | B1 | 6/2018 | Diep et al. |
| 10,410,728 | B2 | 9/2019 | Shim |
| 10,418,104 | B2 | 9/2019 | Maejima |
| 10,607,688 | B2 | 3/2020 | Shin et al. |
| 10,629,272 | B1 | 4/2020 | Lu et al. |

(Continued)

OTHER PUBLICATIONS

U.S. Appl. No. 17/007,442, filed Aug. 31, 2020.
(Continued)

*Primary Examiner* — Jason Lappas
(74) *Attorney, Agent, or Firm* — Vierra Magen Marcus LLP

(57) ABSTRACT

Apparatuses and techniques are described for reducing read disturb in a memory device by reducing the channel gradient and therefore reducing the charge injection to the memory cell. Channels of unselected NAND strings are boosted before reading memory cells in selected NAND strings. The boosting involves applying a positive voltage to source ends and drain ends of the unselected NAND strings, while drain-side select gate transistors are turned on and then off and a voltage signal of non-adjacent word lines of a selected word line, WLn, increases to a read pass voltage. A voltage signal of adjacent word lines of WLn is increased to a peak level to increase the channel conduction for faster read, where the peak level is less than the read pass voltage, decreased to a reduced level to reduce a channel gradient and therefore reduce a read disturb, then increased to the read pass voltage.

20 Claims, 19 Drawing Sheets

(56) References Cited

U.S. PATENT DOCUMENTS 10,685,723 B1 6/2020 Chen et al.
2016/0163394 A1 6/2016 Yoo et al.

OTHER PUBLICATIONS

International Search Report & The Written Opinion of the International Searching Authority dated Sep. 28, 2021, International Application No. PCT/US2021/033723.

* cited by examiner

Fig. 1A
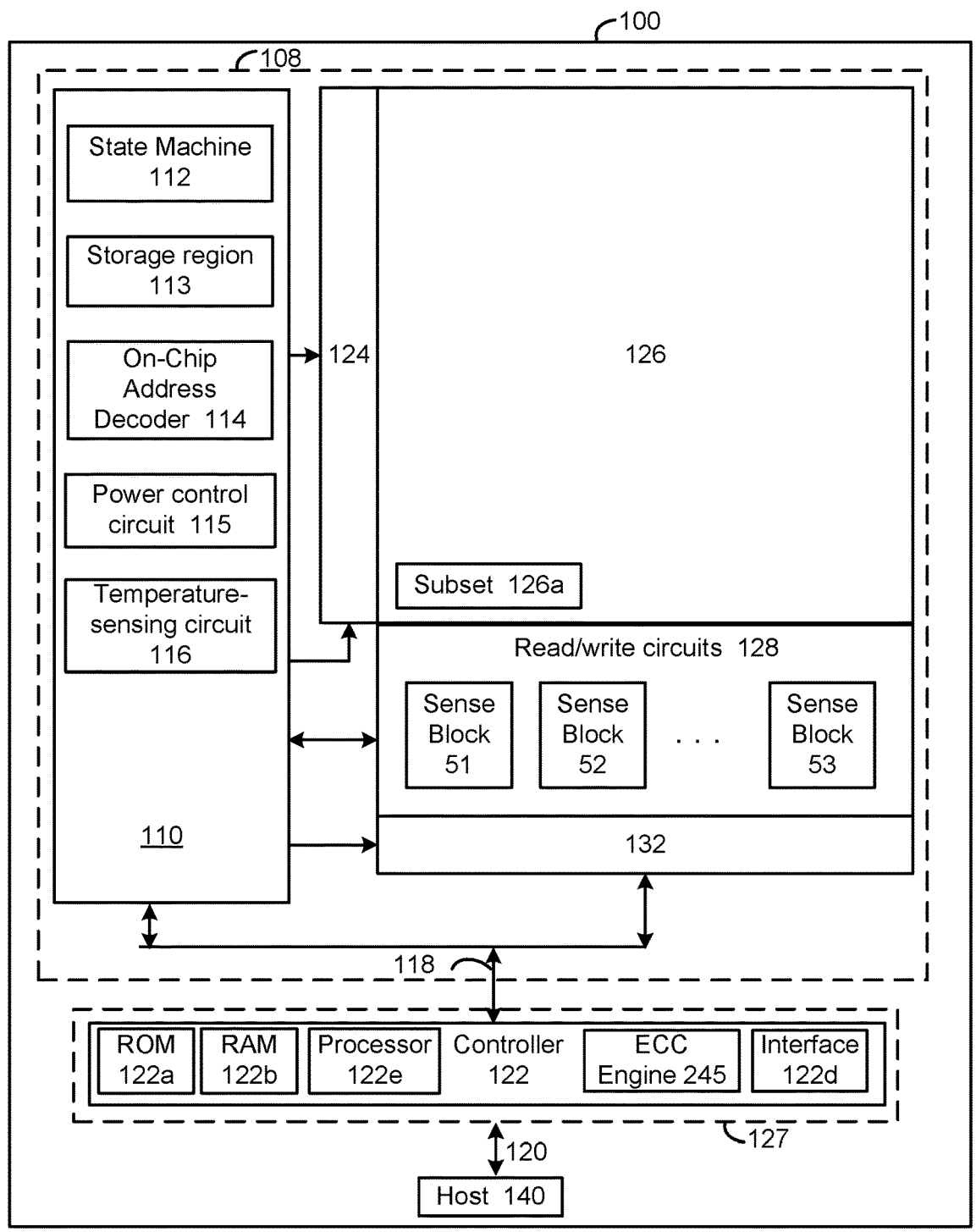
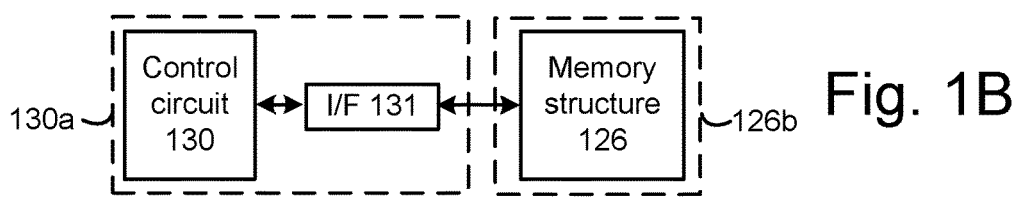
Fig. 1B

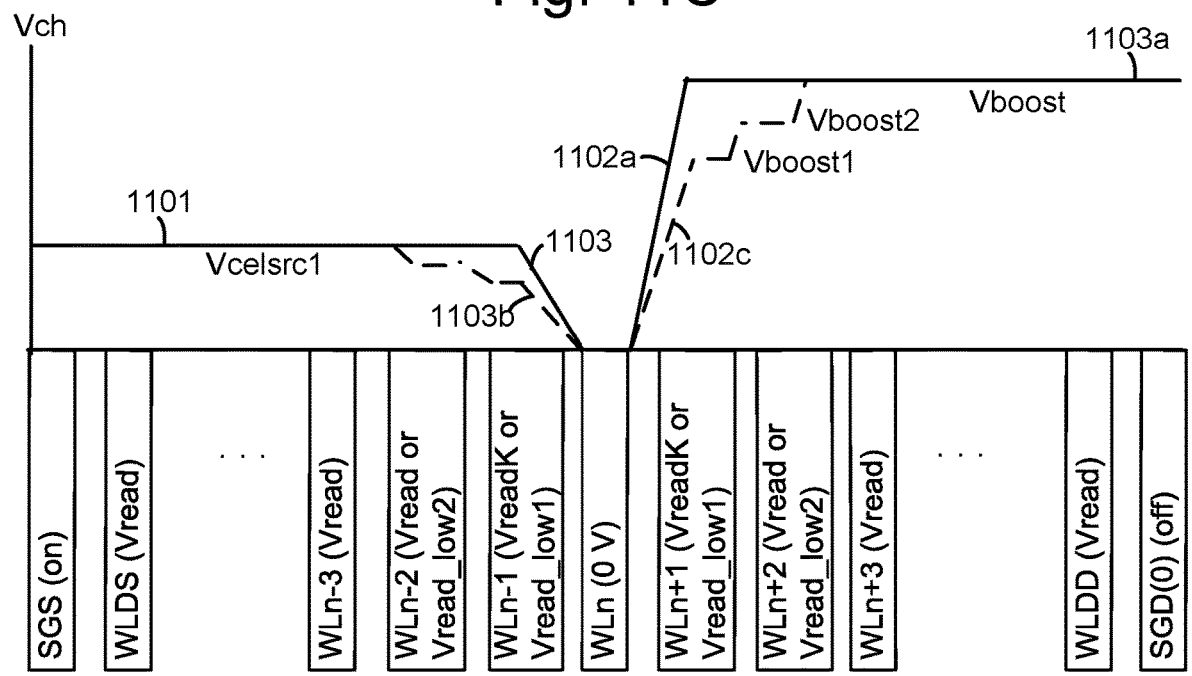

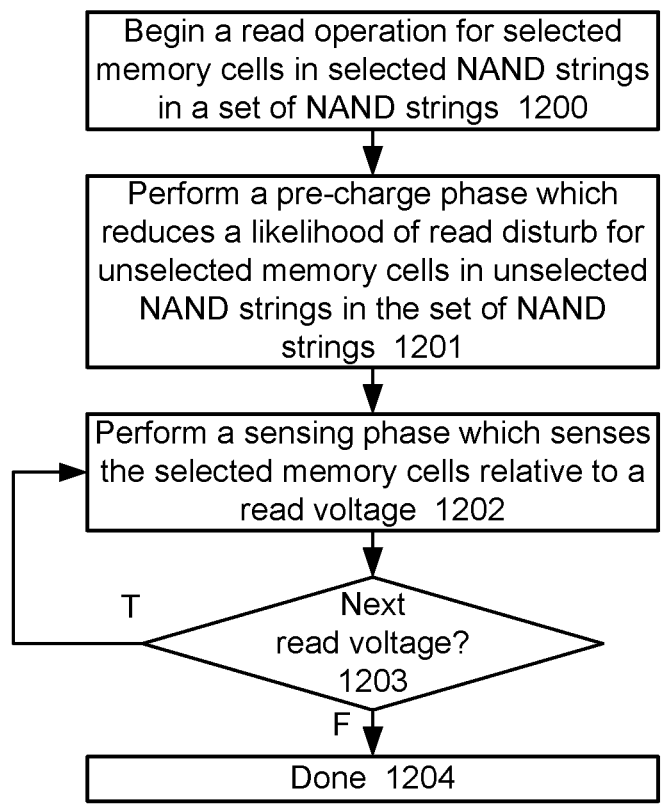

CONTROLLING WORD LINE VOLTAGES TO REDUCE READ DISTURB IN A MEMORY DEVICE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B is a block diagram of an arrangement of the memory device 100 of FIG. 1A in which a control circuit 130 on a first die 130a communicates with the memory structure 126 on a separate second die 126b.

FIG. 11C depicts another example of channel voltages in the unselected NAND string of FIG. 11A in the pre-charge phase of the read operation, when the SGD and SGS transistors are turned off, resulting in a channel gradient which can disturb memory cells in the NAND string.

FIG. 12A depicts a flowchart showing an overview of example process for reducing disturbs in a read operation, consistent with FIGS. 11B and 11C.

FIG. 13B depicts an example voltage signal having a voltage over kick, consistent with FIG. 12C, step 1223a.

DETAILED DESCRIPTION

Figure 1C:
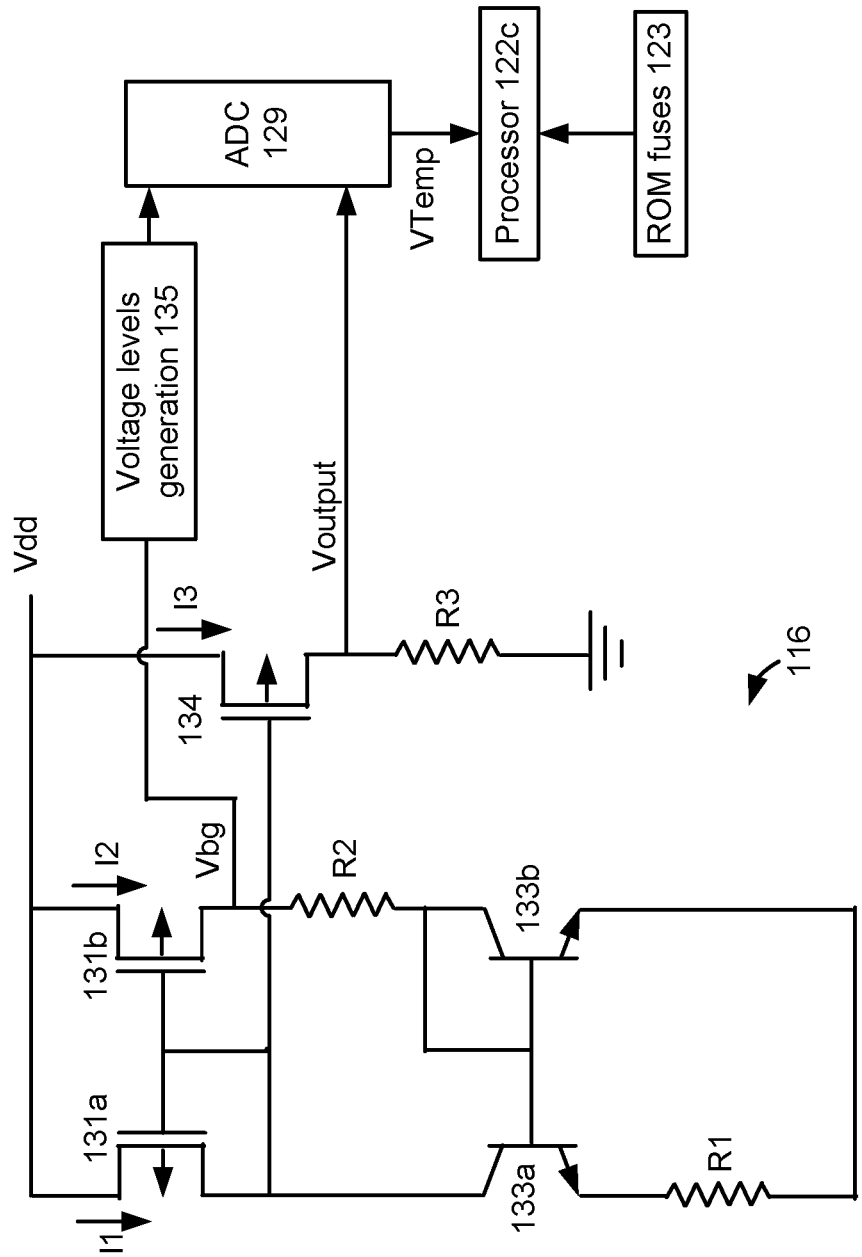
FIG. 1C depicts an example of the temperature-sensing circuit 116 of FIG. 1A.

Apparatuses and techniques are described for reducing disturbs during a read operation in a memory device.

In some memory devices, memory cells are connected to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. See FIG. 8, for example. Memory cells can be connected in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extend vertically in the stack, such as a blocking oxide layer, a charge trapping layer, a tunneling layer and a channel layer. See FIGS. 5 and 6, for example.

In a 2D memory structure, the memory cells may be arranged in horizontal NAND strings on a substrate. See FIG. 9, for example.

The memory cells can be programmed to have a threshold voltage (Vth) which corresponds to a data state. See FIG. 10, for example. The Vth is a function of an amount of charge stored in a charge storing material of the memory cell. A read operation can be performed to determine the Vth and therefore the data state of a memory cell. Reading can also be performed in a verify test of a program operation, where the Vth of a memory cell is compared to a verify voltage applied to a corresponding word line to determine if the programming of the memory cell is completed. Reading can also be performed in a verify test of an erase operation, where the Vth of a memory cell is compared to a verify voltage applied to a corresponding word line to determine if the erasing of the memory cell is completed.

A read operation is typically performed on memory cells in a selected sub-block of a block. The remaining sub-blocks of the block are unselected sub-blocks. However, the application of voltages to the word lines used during reading of NAND strings in the selected sub-block can disturb memory cells in the NAND strings in the unselected sub-blocks, since the word lines are shared by NAND strings throughout the block. One type of read disturb is caused by weak Fowler-Nordheim (F-N) tunneling. In this case, there is a large voltage difference between the control gate and a channel of a cell which attracts electrons from the channel into the charge trapping layer. For example, the control gate can be at a relatively high read pass voltage of 8-9 V.

One countermeasure is to pre-charge the channels of the NAND strings in the unselected sub-blocks before reading the NAND strings in the selected sub-block. The pre-charging can involve biasing the ends of the NAND strings in the unselected sub-blocks while the memory cells are turned on. In this pre-charge phase of the read operation, the SGS transistors are turned on and kept on, and the SGD transistors are turned on and then off. The drain-side and source-side regions of the channels of the NAND strings in the unselected sub-blocks are therefore connected. In a subsequent sensing phase of the read operation, a read voltage is applied to a selected word line to read the NAND strings in the selected sub-block.

Due to the goal of increasing performance, the duration of the pre-charge phase should be minimized. However, if the duration is too short, a channel gradient can be created in the NAND strings in the unselected sub-blocks which results in a hot electron injection (HEI) type of read disturb. In this case, a channel gradient generates electron-hole pairs in which electrons can be injected into the memory cell, increasing its Vth. The boosting of the channel in the pre-charge phase can sometimes increase the likelihood of the injection type of disturb as described, e.g., in connection with FIGS. 11B and 11C. This type of disturb occurs when the SGD transistors are turned off while the voltages on the unselected word line continue to increase to a read pass level. The continuing increase of the voltage capacitively couples up the channel, particularly on the drain side of the selected word line, WLn, resulting in a large channel gradient. This type of disturb is particularly prevalent on memory cells of the WLn+1 word line, which is a drain-side adjacent word line of WLn. The electrons generated by the channel gradient can be injected into the memory cells of the WLn+1 word line, in particular.

Techniques provided herein address the above and other issues. In one aspect, a read operation includes a pre-charge phase and a sensing phase. In the pre-charge phase, a voltage signal applied to a drain-side adjacent word line of a selected word line is increased from an initial level, in which the associated memory cells are turned off, to a peak level, in which the associated memory cells are turned on, and then decreased from the peak level to a reduced level. The reduced level can be a positive voltage. For example, see the plots 1314 and 1315 in FIG. 13A, where the voltage signal is increased from 0 V at t0 to Vspike2 at t3 and then decreased to Vread_low1 (plot 1314) at t5 or Vread_low2 (plot 1315) at t4, in a pre-charge phase from t0-t9. At the same time this voltage signal is applied, a voltage signal is applied to the non-adjacent word lines which increases from an initial level to a read pass level, Vread. For example, see the plots 1311 and 1312 in FIG. 13A.

For the NAND strings in the unselected sub-blocks, the drain-side select gate transistors (SGD transistors) are turned on and then off. For example, see the plot 1321 and 1323 for Vsg_unsel in FIG. 13A. When the SGD transistor turns off, e.g., at t5, the voltage signal applied to the non-adjacent word lines continues to increase to Vread, e.g., from t5-t8. This causes a channel gradient and an associated disturb. However, the magnitude of the channel gradient is reduced due to the voltage signal applied to the drain-side adjacent word line decreasing from the peak level to the reduced level, compared to the case of the voltage signal increasing to a read pass level. See FIGS. 11B and 11C. By avoiding a further increase of the voltage signal of the drain-side adjacent word line to Vread at this time, capacitive coupling up of the corresponding channel region is avoided. As a result, the channel gradient and likelihood of a disturb is reduced.

Also in the pre-charge phase, a voltage signal for the selected word line can increase from an initial level to a peak level, e.g., Vspike1 (plot 1301) and then decrease to a reduced level, e.g., 0 V. The source-side select gate transistors (SGS transistors) can be turned on and kept on. See, e.g., plot 1320 and 1322 and Vsgs. A positive voltage Vcelsrc1 (plot 1340) can be applied to the source ends of the NAND strings while a positive voltage Vbl1 (plot 1330) can be applied to the drain ends of the NAND strings.

In one option, the reduced level of the voltage signal applied to the drain-side adjacent word line, Vread_low, is adjusted based on a factor which indicates a risk of read disturb, such as a temperature or a position of the selected word line.

In another option, the voltage signal applied to the drain-side adjacent word line of the selected word line is also applied to a source-side adjacent word line of the selected word line.

Figure 13A:
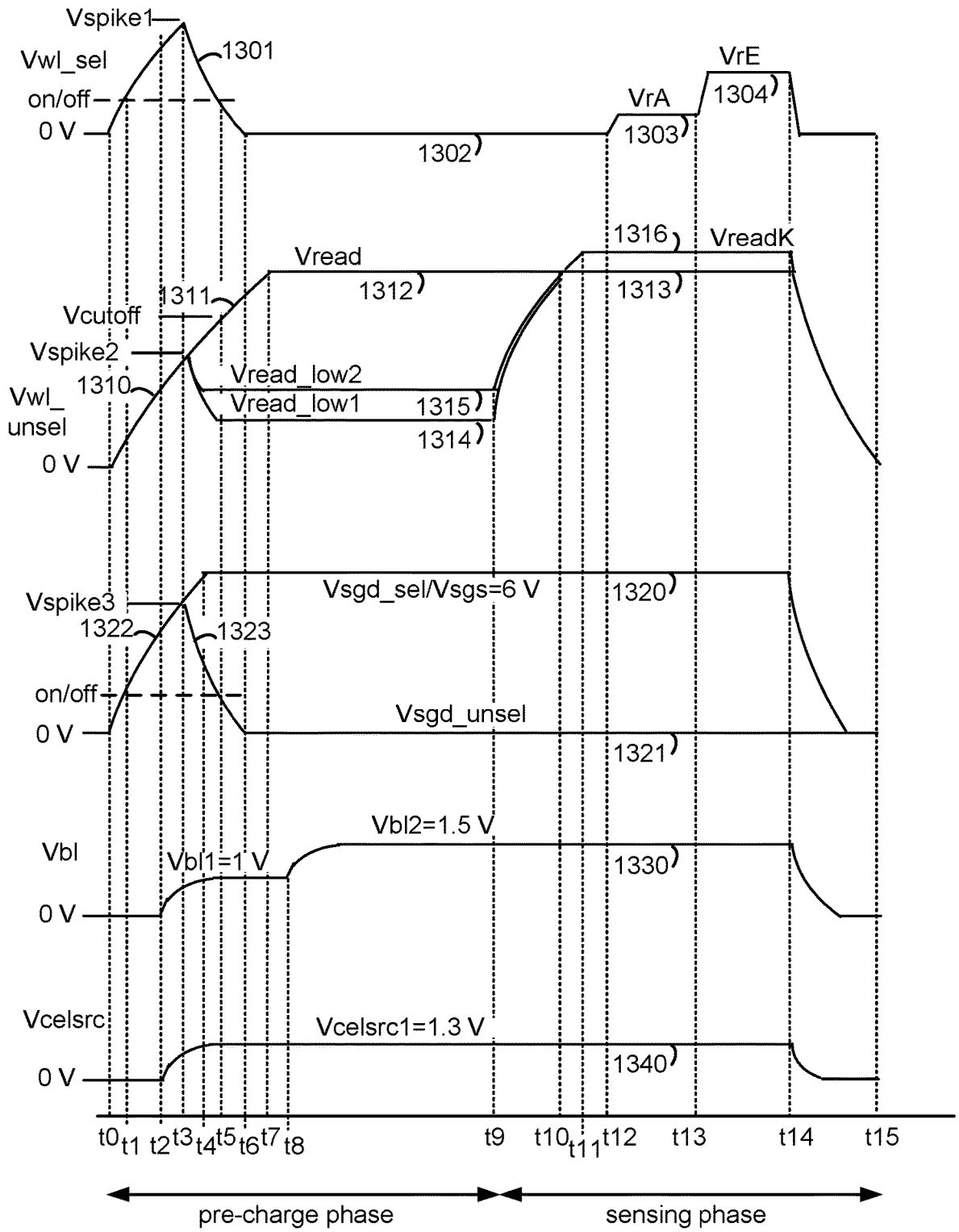
FIG. 13A depicts example voltage signals in a read operation consistent with FIG. 12A to 12C.

In another option, a voltage signal applied to an additional drain-side word line of the selected word line can be configured to reduce the likelihood of a disturb, similar to the voltage signal applied to the drain-side adjacent word line. For example, see the reduced level of the additional drain-side word line (Vread_low2 in FIG. 13A, plot 1315). Vread_low2 can be greater than the reduced level of the drain-side adjacent word line (see Vread_low1 in FIG. 13A, plot 1314).

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control circuit 115, and a temperature-sensing circuit 116. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The temperature-sensing circuit 116 can detect a temperature of the memory device at the time of a program operation. See FIG. 1C for an example implementation of the temperature-sensing circuit. The temperature-sensing circuit, program loop tracking circuit and verify test-setting circuit may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, temperature-sensing circuit 116, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The controller, e.g., RAM 122b and/or the control circuitry 110, can store parameters which indicate an expected number of fail bits in a block. These parameters can include, e.g., the number of bits per cell stored in the memory cells, a portion of the word lines which are programmed in a block or sub-block, a portion of the sub-blocks which are programmed in a block, a strength of an ECC process used to store and read data in the block, a duration of pre-read voltage pulse, if used, and a read accuracy, such as a bit line or word line voltage settling time and a number of sensing passes.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. For example, see FIG. 9. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. For example, see FIG. 5. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B is a block diagram of an arrangement of the memory device 100 of FIG. 1A in which a control circuit

130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. For example, the control circuit can issue commands to the voltage drivers in FIG. 3 to provide the voltage signals of FIG. 13 in accordance with the flowcharts of FIG. 12A-12C.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 1C depicts an example of the temperature-sensing circuit 116 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122e. This is data indicating a temperature of the memory device. ROM fuses 123 store data which correlates the matching voltage level to a temperature, in one approach. The temperature can be used to set a temperature-based lockout condition in the memory device, for example.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 14A:
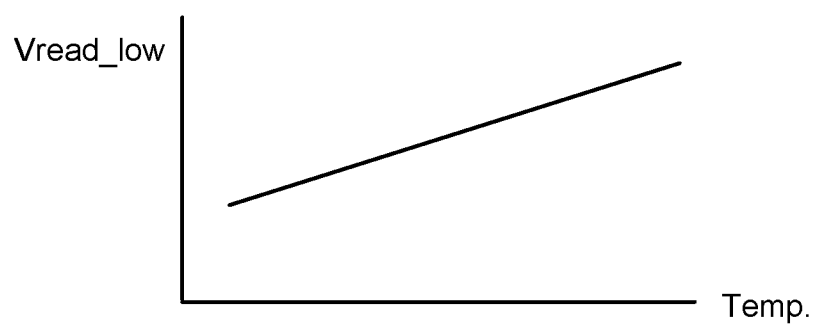
FIG. 14A depicts a plot showing how Vread_low in FIG. 13A can vary with temperature, consistent with FIG. 12B, step 1213c.
Figure 14B:
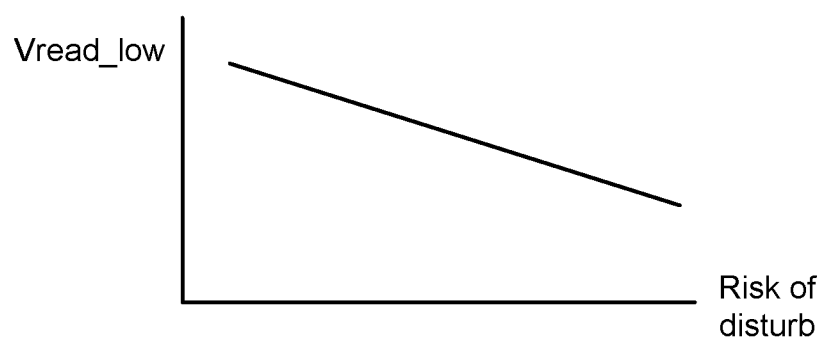
FIG. 14B depicts a plot showing how Vread_low in FIG. 13A can vary with a risk of disturb, consistent with FIG. 12B, step 1213c.

An indication of a temperature from the temperature-sensing circuit can be used, e.g., in the plot of FIG. 14B to set a level of Vread_low. The temperature can be the ambient temperature of a memory device.

Figure 2:
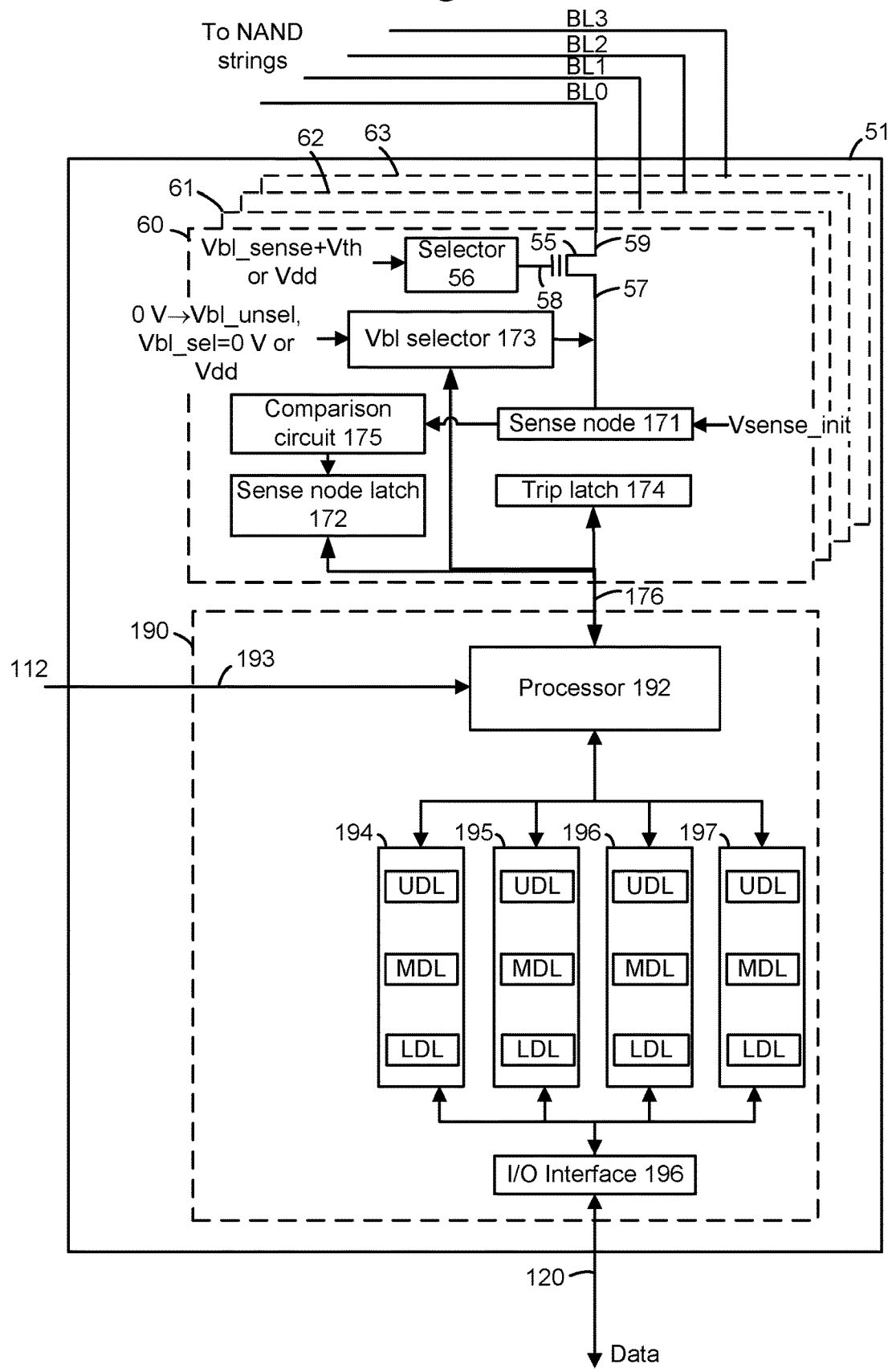
FIG. 2 is a block diagram depicting one embodiment of the sense block 51 of FIG. 1A.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIG. 8, each bit line is connected to four NAND strings,—one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the control gate of the transistor 55 to provide Vbl_sense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
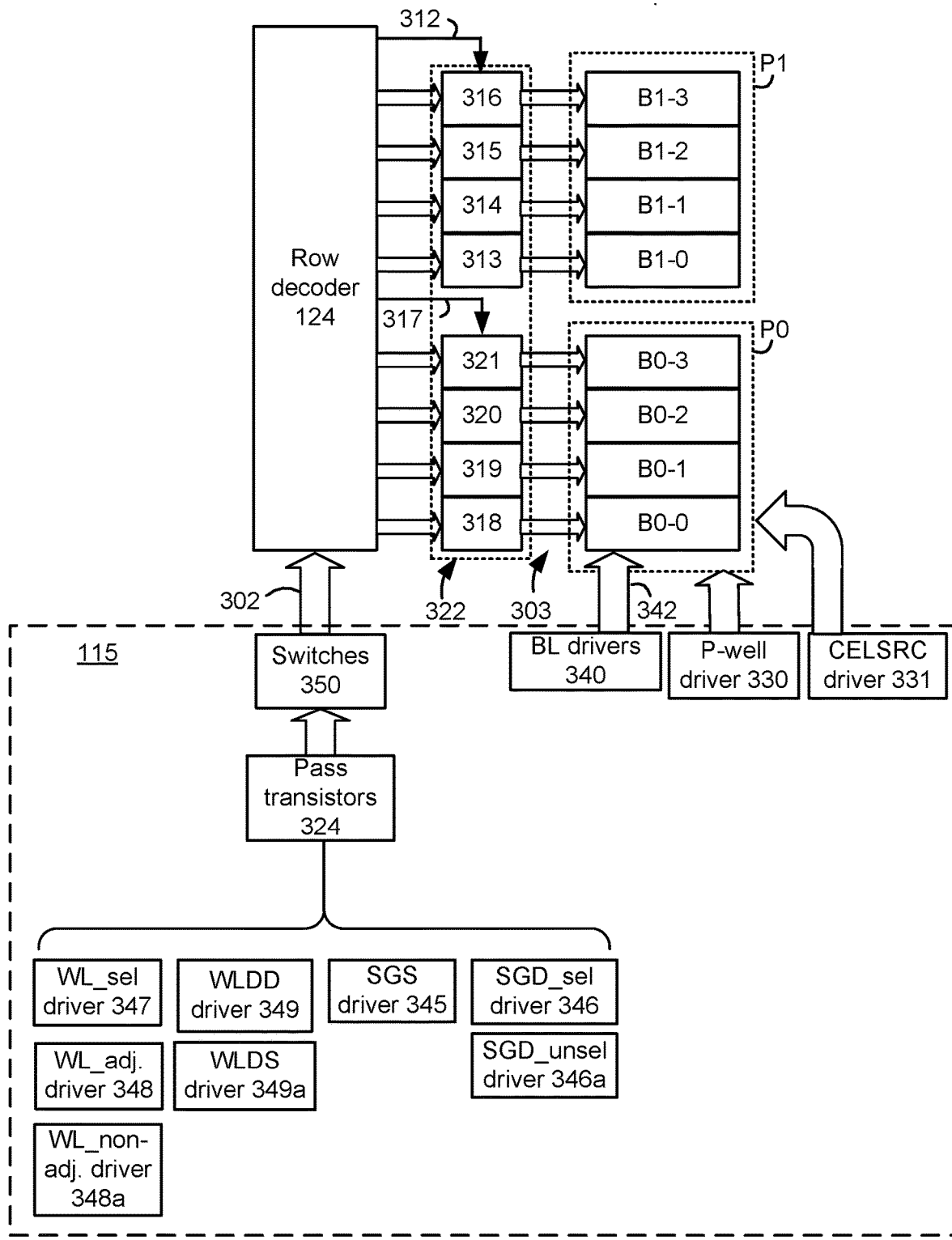
FIG. 3 depicts an example implementation of the power control circuit 115 of FIG. 1A for providing voltages to blocks of memory cells.
Figure 8:
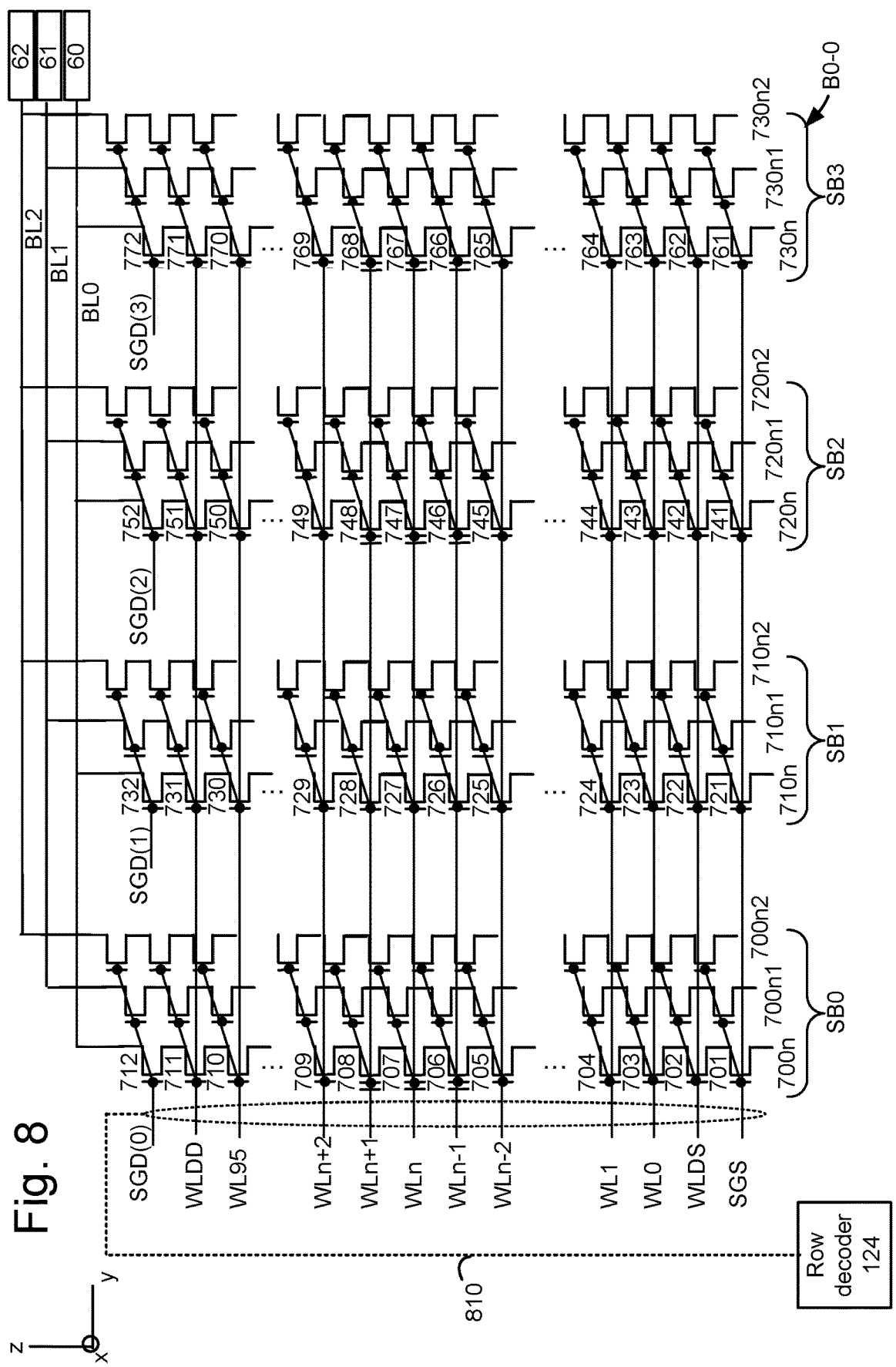
FIG. 8 depicts an example view of the block B0-0 of FIG. 4, with respective NAND strings arranged in sub-blocks, along with associated bit lines and sense circuits.

FIG. 3 depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, P0, and another set of four blocks, B1-0 to B1-3, in another plane, P1, consistent with FIG. 4. Generally, the blocks can be in one or more planes. The row decoder 124 of FIG. 1A provides voltages to word lines and select gate control lines of each block via pass transistors 322. In one approach, a separate row decoder is provided for each block. The row decoder can be provided one side of a block, such as depicted in FIG. 8. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, which in turn are connected to control gate lines of B1-0 to B1-3, respectively. A control gate line 317 is connected to sets of pass transistors 318-321, which in turn are connected to control gate lines of B0-0 to B0-3, respectively.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL_sel driver 347, provides a voltage signal on a data word line which is selected during a program or read operation. The WL_adj. driver 348 provides a voltage signal on unselected data word lines which are adjacent to the selected word line, WLn. These unselected data word lines include a drain-side adjacent word line, WLn+1, and a source-side adjacent word line, WLn−1. In one option, a voltage driver for WLn+1 is separate from a voltage driver for WLn−1. It is also possible to provide separate voltage drivers for WLn+2 and/or WLn−2, for example, and for other word lines. The WL_non-adj. driver 348a provides a voltage signal on unselected data word lines which are not adjacent to the selected word line, WLn. These are non-adjacent word lines of the selected word line, and can include, e.g., WL0 to WLn−2 and WLn+2 to WL95, when there are 96 word lines.

Dummy word line drivers are also provided. The WLDD driver 349 provides a voltage signal on the drain-side dummy word line, WLDD, and the WLDS driver 349a provides a voltage signal on the source-side dummy word line, WLDS.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD_unsel driver 346a for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 524 in the p-well region 592, e.g., via the conductive path 524a. See FIG. 5. In one approach, the p-well region 592 is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+ contact 523 in the p-well region 592, e.g., via the local interconnect 523a in FIG. 5.

Bit line voltage drivers 340 include voltage sources which provide voltages to the bit lines 342. The bit line voltage for sensing can be 0.5 V, for example.

Figure 4:
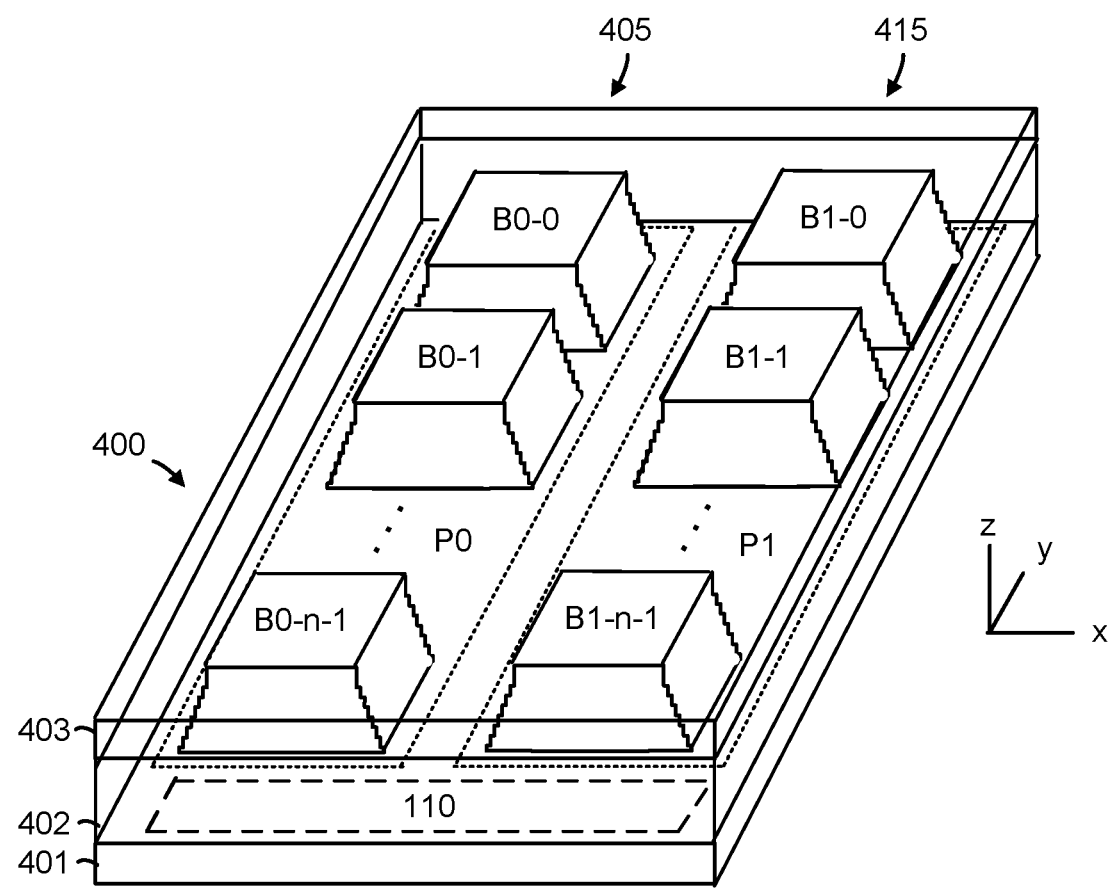
FIG. 4 is a perspective view of an example memory die 600 in which blocks are provided in respective planes P0 and P1, consistent with FIG. 3.

FIG. 4 is a perspective view of an example memory die 400 in which blocks are provided in respective planes P0 and P1, consistent with FIG. 3. The memory die includes a substrate 401, an intermediate region 402 in which blocks of memory cells are formed, and an upper region 403 in which one or more upper metal layers are patterned such as to form bit lines. Planes P0 and P1 represent respective isolation regions which are formed in the substrate 401. Further, a first block sequence 405 of a number n blocks, labelled B0-0 to B0-n-1, are formed in P0, and a second block sequence 415 of a number n blocks, labelled B1-0 to B1-n-1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erased concurrently.

The substrate 401 can also carry circuitry under the blocks, and one or more lower metal layers which are patterned in conductive paths to carry signals of the circuitry.

Figure 5:
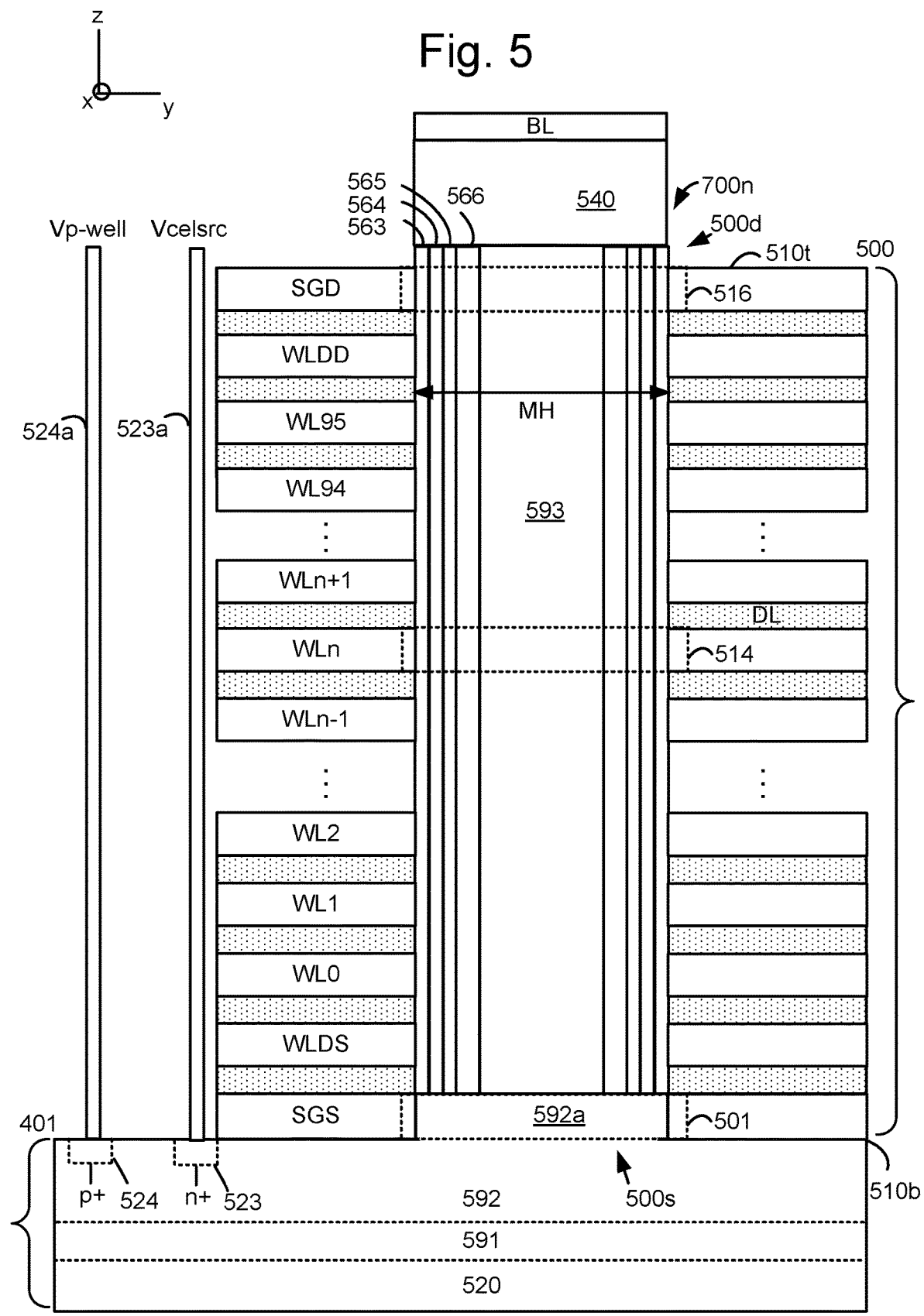
FIG. 5 depicts an example cross-sectional view of a portion of the block B0-0 of FIG. 4, including a NAND string 700n.

In this example, the memory cells are formed in vertical NAND strings in the blocks, consistent with FIG. 5. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

Figure 9:
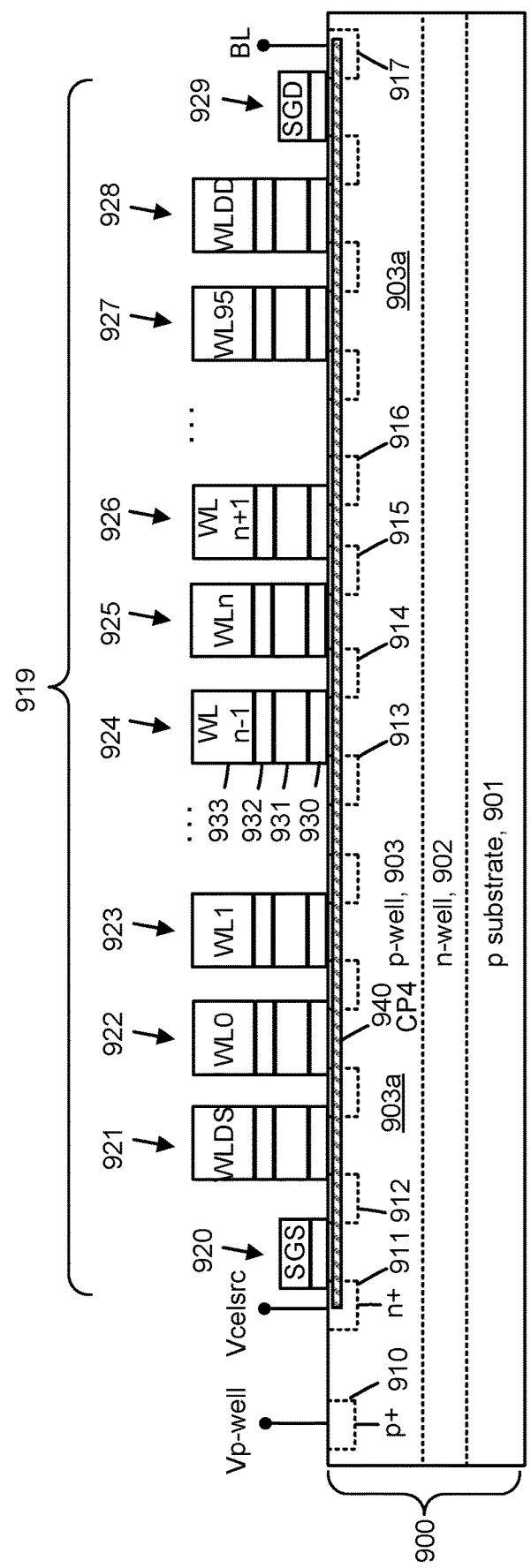
FIG. 9 depicts an example NAND string in a 2D configuration.

While the above example is directed to a 3D memory device with vertically extending NAND strings, the techniques provided herein are also applicable to a 2D memory device in which the NAND strings extend horizontally on a substrate, consistent with FIG. 9.

FIG. 5 depicts an example cross-sectional view of a portion of the block B0-0 of FIG. 4, including a NAND string 700n. The block comprises a stack 500 of alternating conductive layers (e.g., select gate layers and word line layers) and dielectric layers. The layers may be rectangular plates having a height in the z direction, a width in the y direction, and a length in the x direction. Example conductive layers include SGS, WLDS, WL0, WL1, WL2, . . . , WLn-1, WLn, WLn+1, . . . , WL94, WL95, WLDD and SGD. WLn denotes a selected word line for a read or program operation. The dielectric layers are shown by a dotted pattern and include an example dielectric layer DL. The conductive layers extend in a memory hole MH (see also FIG. 6).

The stack is depicted as comprising one tier but can optionally include one or more tiers of alternating conductive and dielectric layers. For example, see a stack comprising a bottom tier (BT) and a top tier (TT) in FIG. 7. A stack comprises a set of alternating conductive and dielectric layers in which a memory hole is formed in a fabrication process.

The conductive layers comprise SGS, WLDS, WL0-WL95, WLDD and SGD(0), in addition to 96 data word lines in this example, although the number of data word lines could be greater or less than 96.

The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data.

A top 510t and bottom 510b of the stack are depicted. WL95 is the topmost data word line and WL0 is the bottommost data word line.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 516 is formed where the SGD control line intersects with the multiple thin layers, a source-side select gate transistor 501 is formed where the SGS control line intersects with the multiple thin layers, and a selected memory cell 514 is formed where WLn intersects with the multiple thin layers.

The multiple thin annular layers can be deposited, e.g., using atomic layer deposition. For example, the layers can include a blocking oxide layer 563, a charge-trapping layer 564 or film such as silicon nitride (Si3N4) or other nitride, a tunneling layer 565 (e.g., a gate oxide) and a channel layer 566 (e.g., comprising polysilicon). A dielectric core 593 (e.g., comprising silicon dioxide) can also be provided. In this example, all of the layers are provided in the memory hole. In other approaches, some of the layers can be provided in the word line or control line layer. The multiple thin layers form a columnar active area of a NAND string. A word line or control line can comprise a metal such as Tungsten.

The stack is formed on the substrate 401. In one approach, the substrate includes a p-well region 592 (see also FIG. 3) connected to the source ends of the NAND strings. The p-well region may comprise an epitaxial region 592a which extends upward adjacent to the SGS layer. The p-well region can include an n+ contact 523 connected to a local interconnect 523a (a conductive path or source line) for receiving Vcelsrc, and a p+ contact 524 connected to a conductive path 524a for receiving Vp-well. The local interconnect and conductive path can comprise a conductive material such as metal surrounded by an insulating material to prevent conduction with the metal of the adjacent word lines. The p-well region 592 can be formed in an n-well 591, which in turn is formed in a p-type semiconductor region 520 of the substrate, in one possible implementation.

The NAND string 700n has a source end 500s at a bottom 510b of the stack 500, connected to the p-well. The NAND string 500n also has a drain end 500d at a top 510t of the stack, connected to a bit line BL0 via a bit line contact 540 comprising an n-type material.

The NAND string in this 3D configuration is considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate, causing the electrons to return to the channel from the charge trapping layer.

Figure 6:
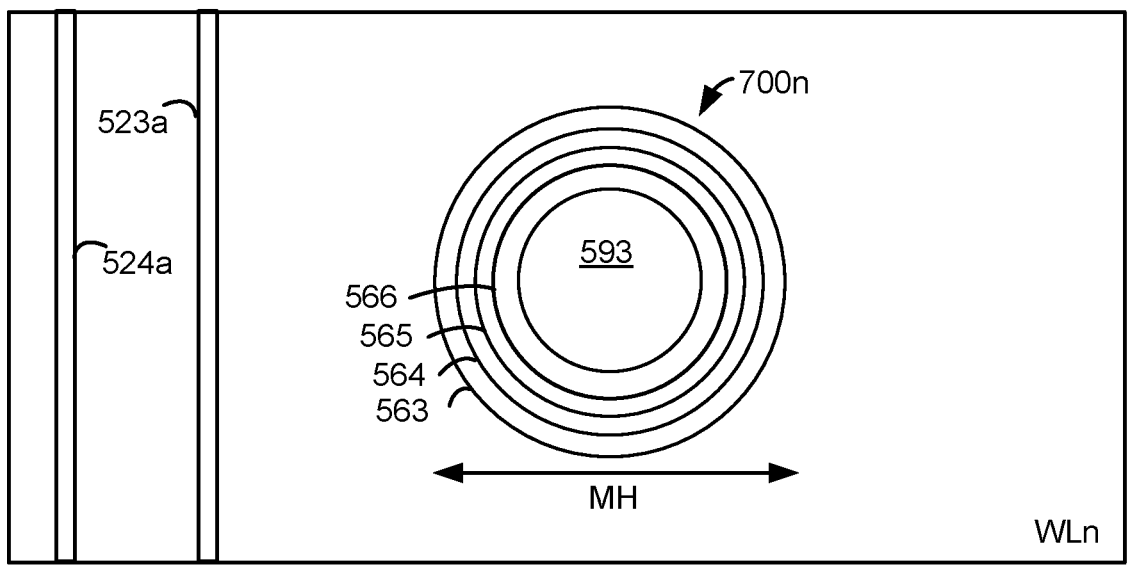
FIG. 6 depicts an example cross-sectional view of the block portion of FIG. 5 in the x-y plane at the level of WLn.

FIG. 6 depicts an example cross-sectional view of the block portion of FIG. 5 in the x-y plane at the level of WLn. The layers of the NAND string 700n are depicted, including the blocking oxide layer 563, charge-trapping layer 564, tunneling layer 565 and the channel layer 566. The dielectric core 593 is also depicted.

Figure 7:
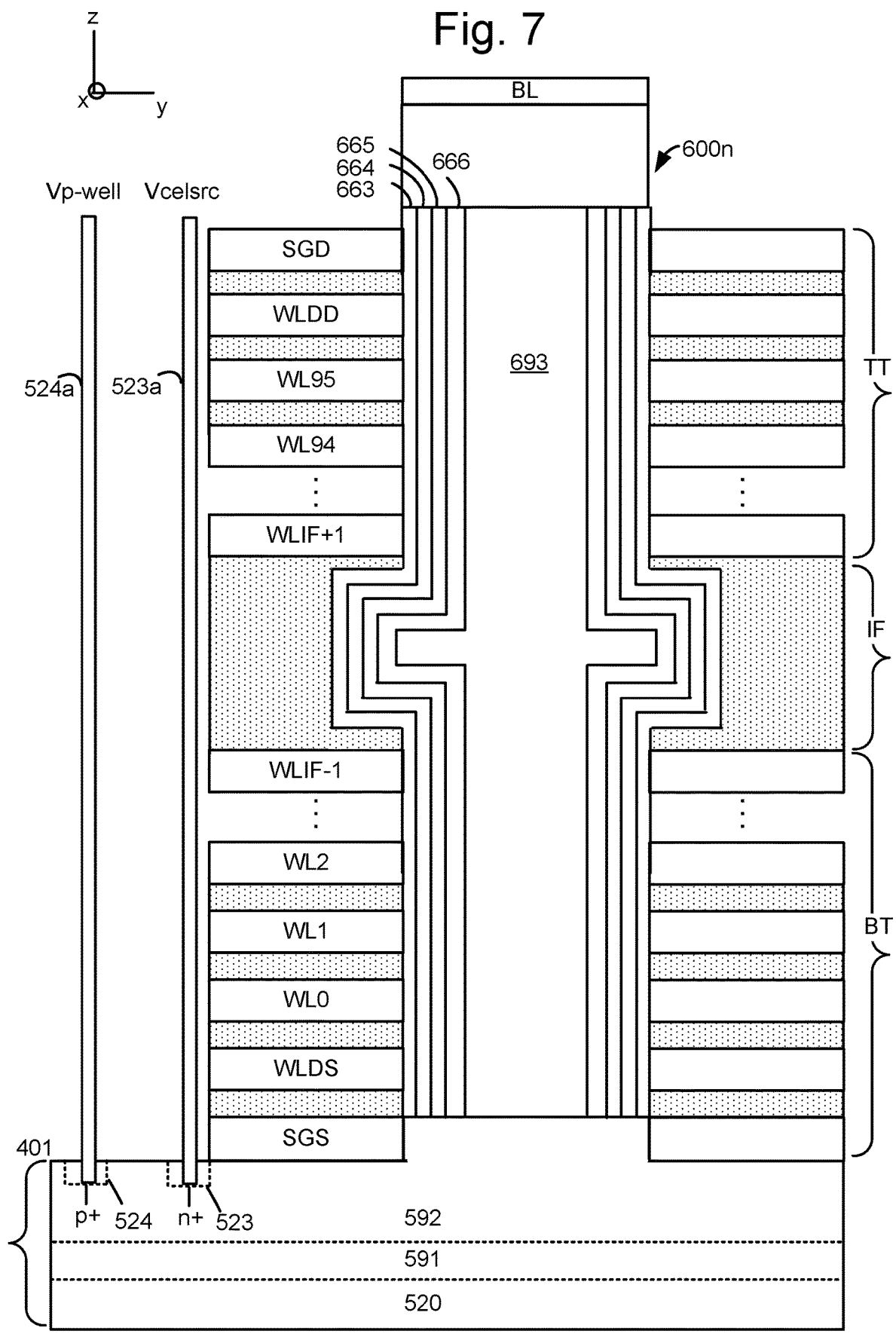
FIG. 7 depicts another example cross-sectional view of a portion of the block B0-0 of FIG. 4, including a NAND string 600n, where the block comprises two tiers.

FIG. 7 depicts another example cross-sectional view of a portion of the block B0-0 of FIG. 4, including a NAND string 600n, where the block comprises two tiers. Like-numbered elements correspond to those in FIG. 5. A multi-tier stack can be taller and have more layers than a single tier stack, which is limited by the ability to accurately etch a memory hole through multiple layers. In a multi-tier stack, a bottom tier of layers is formed and memory holes are etched. A top tier of layers is then formed on the bottom tier and memory holes are etched in the top tier which align with the memory holes in the bottom tier, to form continuous memory holes which extend through both tiers. Two or more tiers can be used. The top of the memory hole of the first tier tends to be widened at the top, in the IF, to form a base for aligning with the later formed memory hole in the top tier. A NAND string 600n is formed which includes a blocking oxide layer 663, a charge-trapping layer 664, a tunneling layer 665, a channel layer 666, and a dielectric core 693.

In this example, the block comprises a stack of alternating conductive and dielectric layers in two tiers, including a bottom tier BT and a top tier TT. The tiers are separated by an interface (IF) region which is formed of a dielectric material. The word lines include, e.g., WL0 to WLIF−1 in the BT, and WLIF+1 to WL95 in the TT, where WLIF−1 is the word line adjacent to and below the IF, and WLIF+1 is the word line adjacent to and above the IF. Optionally, the word lines adjacent to the IF are allocated as dummy word lines.

Additionally, the height of the IF is greater than the height of the remaining dielectric layers between the word lines. As a result, there is a reduced conductivity in the interface so it is more difficult for the electrons to move through the interface. This configuration can make the memory cells in the top or bottom tier more susceptible to read disturb. In some cases, the position of a memory cell (e.g., the position of a selected word line) within a tier affects the risk of a disturb.

FIG. 8 depicts an example view of the block B0-0 of FIG. 4, with respective NAND strings arranged in sub-blocks, along with associated bit lines and sense circuits. The NAND strings are arranged in sub-blocks of the block in a 3D configuration. The block is consistent with FIGS. 5 to 7. Each sub-block SB0-SB3 includes multiple NAND strings.

Three example NAND strings are depicted, as a simplification. For example, SB0 comprises NAND strings 700n, 700n1 and 700n2, SB1 comprises NAND strings 710n, 710n1 and 710n2, SB2 comprises NAND strings 720n, 720n1 and 720n2, and SB3 comprises NAND strings 730n, 730n1 and 730n2. The NAND strings have data word lines, dummy word lines and select gate lines. Each sub-block comprises a set of NAND strings which extend in the x direction and which have a common SGD line or control gate layer. In particular, SGD(0)-SGD(3) are in SB0-SB3, respectively.

Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

Reading can occur for memory cells connected to a selected word line in a selected sub-block. Reading can occur one sub-block at a time.

In an erase operation, typically the entire block is erased, although a partial block erase is also possible.

Each NAND string comprises a plurality of memory cells between an SGS transistor and a SGD transistor, in this example. In other examples, more than one SGD and/or SGS transistor can be provided for each NAND string. The number of dummy memory cells can also vary. For example, the NAND string 700n includes an SGS transistor 701, a dummy memory cell 702, data memory cells 703-710, a dummy memory cell 711 and an SGD transistor 712. The NAND string 710n includes an SGS transistor 721, a dummy memory cell 722, data memory cells 723-730, a dummy memory cell 731 and an SGD transistor 732. The NAND string 720n includes an SGS transistor 741, a dummy memory cell 742, data memory cells 743-750, a dummy memory cell 751 and an SGD transistor 752. The NAND string 730n includes an SGS transistor 761, a dummy memory cell 762, data memory cells 763-770, a dummy memory cell 771 and an SGD transistor 772.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

A set of bit lines, including example bit lines BL0-BL2, are connected to the NAND strings. Each bit line is connected to a respective set of NAND strings, including one NAND string in each sub-block. For example, BL0 is connected to NAND strings 700n, 710n, 720n and 730n in SB0-SB3, respectively, BL1 is connected to NAND strings 700n1, 710n1, 720n1 and 730n1 in SB0-SB3, respectively, and BL2 is connected to NAND strings 700n2, 710n2, 720n2 and 730n2 in SB0-SB3, respectively. Each bit line is also connected to a respective sense circuit, consistent with the sense circuits of FIG. 2. For example, BL0-BL2 are connected to sense circuits 60-62, respectively.

The row decoder 124 is at one side of the block in this example, in a peripheral area of the substrate, consistent with the control circuitry 110 depicted in FIG. 4. The row decoder routes voltage signals to the word line via conductive paths 810. In one approach, the conductive paths extend vertically in the z direction to the upper region 403, then horizontally in the y direction and then vertically down in the −z direction in vias which contact the word lines. The side of the block may have a stair step shape in which the vias can contact an edge of each word line. In this example, it is assumed that the stair step shape is closest to SB0. As a result, the RC delay of a word line voltage signal will be smallest for SB0 and largest for SB3. The distance between the row decoder and the sub-blocks is considered to increase progressively for SB0-SB3.

FIG. 9 depicts an example NAND string in a 2D configuration. The techniques discussed herein f can be used in a 2D memory device as well as the above-described 3D memory device. The channel in a 2D memory device extends horizontally in the substrate rather than in a vertically extending channel layer. In this example, a substrate 900 includes a p-well 903 within an n-well 902, which in turn is in a p substrate 901. Vp-well and Vcelsrc are provided to the p-well via contacts 910 and 911, respectively. A NAND string 919 is arranged on the substrate and include select gate transistors and memory cells. For example, the NAND string includes a SGS transistor 920, memory cells 921, 922 and 923 connected to WLDS, WL0 and WL1, respectively, memory cells 924, 925 and 926 connected to WLn−1, WLn and WLn+1, respectively, memory cells 927 and 928 connected to WL95 and WLDD, respectively, and a SGD transistor 929. Doped regions in the substrate, such as example doped regions 911-917, act as sources and drains of the transistors. Vbl is provided to the doped region 917. When appropriate voltages are provided to the NAND string, an inversion layer or channel 940 is formed in the p-well. A remaining portion 903*a* of the p-well is biased at Vp-well.

The example memory cell 924 comprises a tunneling layer 930, a floating gate layer 931, a blocking oxide layer 932 and a control gate 933.

Figure 10:
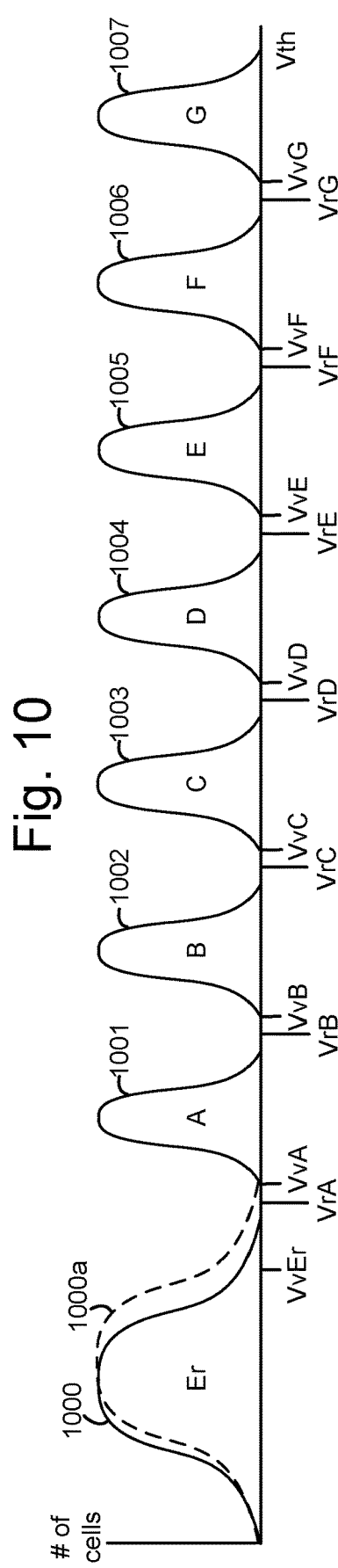
FIG. 10 depicts threshold voltage (Vth) distributions for an eight-state memory device.

FIG. 10 depicts threshold voltage (Vth) distributions for an eight-state memory device. Eight data states, or three bits per cell, are depicted as an example. The techniques herein can apply to other modes include one or more bits per cell. The vertical axis depicts a number of memory cells on a logarithmic scale and the horizontal axis depicts a threshold voltage on a linear scale. The Vth distributions can represent memory cells connected to a word line or all memory cells in a block. After erasing the block, the Vth distribution 1000 is obtained, representing the erased state. The erase operation is completed when the Vth of all, or nearly all, of the memory cells is below a verify voltage of VvEr.

The memory cells are then subject to a programming operation. Each of the memory cells will have an assigned data state. Some of the memory cells are assigned to the erased state and are not programmed. Most of the memory cells are programmed to higher states, such as A-F, in this example, as represented by Vth distributions 1001-1007, respectively. These memory cells are subject to verify tests using verify voltages of VvA-VvG.

In a read operation, the memory cells can be read by applying the read voltages VrA-VrG applied to the selected word line. In one approach, one page of data is read at a time. For example, a lower page of data can be read using VrA and VrE (consistent with FIG. 13A), a middle page of data can be read using VrB, VrD and VrF, and an upper page of data can be read using VrC and VrG.

The widened Vth distribution 1000*a* for the erased state represents memory cells which have experienced a read disturb as described herein. A read disturb increases the upper tail of the Vth distribution of the erased state memory cells, in particular, but could affect other states as well. Some erased state memory cells have their Vth increased above VrA and will be incorrectly read as being in the A state, or even a higher state than the A state.

Figure 11A:
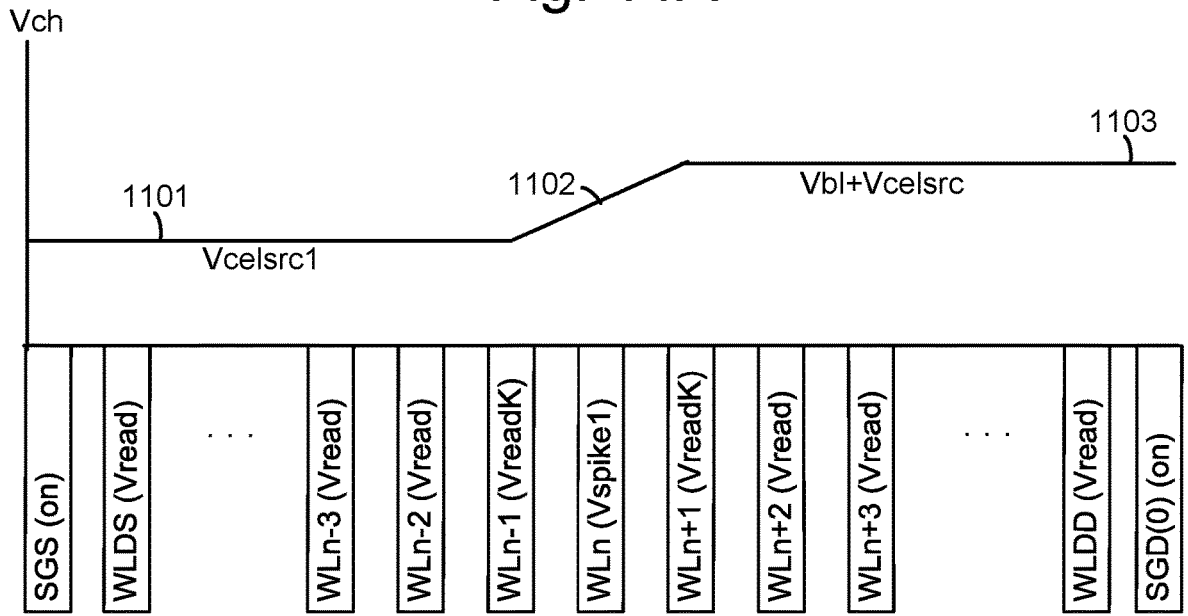
FIG. 11A depicts an example of channel voltages in an unselected NAND string in a pre-charge phase of a read operation, when SGD and SGS transistors are turned on and a positive bias Vbl and Vcelsrc are applied to the drain end and source end, respectively, of the NAND string.
Figure 11B:
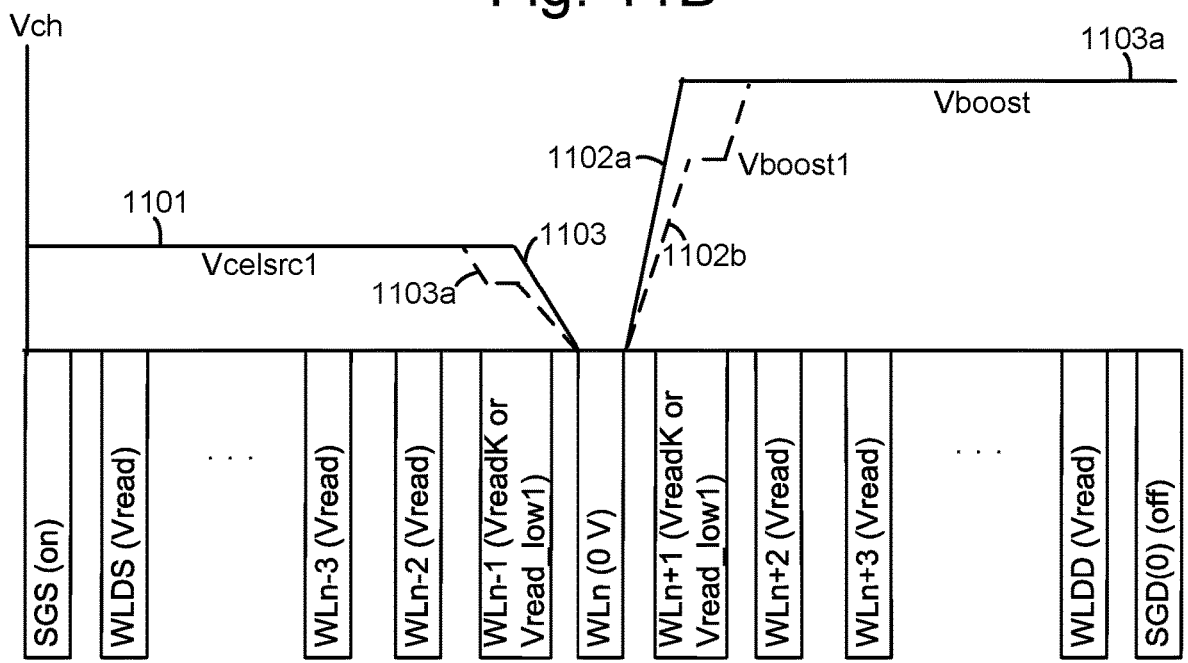
FIG. 11B depicts examples of channel voltages in the unselected NAND string of FIG. 11A in the pre-charge phase of the read operation, when the SGD and SGS transistors are turned off, resulting in a channel gradient which can disturb memory cells in the NAND string.

FIG. 11A to 11C depicts plots of channel voltage, Vch, versus position along the length of a NAND string. The position along the length of the NAND string is denoted by a source-side select gate, SGS, word lines WLDS-WLDD and a drain-side select gate, SGD. The on/off status or voltage of the select gate transistors and word lines is also depicted. This is for an unselected NAND string during a read operation for a selected NAND string, where both NAND strings share a common set of word lines. The unselected NAND string may be in an unselected sub-block while the selected NAND string is in a selected sub-block.

FIG. 11A depicts an example of channel voltages in an unselected NAND string in a pre-charge phase of a read operation, when SGD and SGS transistors are turned on and a positive bias Vbl and Vcelsrc are applied to the drain end and source end, respectively, of the NAND string.

The channel voltages correspond to the time t3 in FIG. 13A. As mentioned, a goal of the pre-charge phase is to boost the channel voltages of the unselected NAND strings to reduce the likelihood of the weak Fowler-Nordheim (F-N) tunneling type of read disturb. In this phase, the SGS transistors are turned on, as denoted by SGS(on). A select gate transistor or a memory cell transistor is turned on or off when it is in a conductive or non-conductive state, respectively. Turning on a transistor refers to transitioning it from a turned off state to a turned on (conductive) state and turning off a transistor refers to transitioning it from a turned on state to a turned off (non-conductive) state. The turning on or turning off can be accomplished by changing the control gate voltage.

The SGD transistors are turned on, as denoted by SGD (on). The memory cells connected to WLDS to WLn−2 and WLn+2 to WLDD are also turned on due to the application of Vread to these word lines. Vread is a nominal read pass voltage such as 8-9 V which is high enough to provide the associated memory cells in a strongly conductive state. The memory cells connected to WLn−1 and WLn+1 are also turned on due to the application of VreadK to these word lines. VreadK is higher than Vread, and is high enough to provide the associated memory cells in a strongly conductive state. VreadK may be applied to the adjacent word lines of WLn to provide sufficient boosting for the channel region adjacent to WLn, which receives a lower voltage than the read pass voltage.

WLn receives a voltage signal which is spiked up to a level, Vspike1, so that the unselected memory cell is briefly turned on or provided in the conductive state, as long as Vspike>Vth of the memory cell. Vspike1 may be sufficient to turn on a memory cell in the erased state or other low state, for example, and may be high enough to turn on a memory cell in the highest state, e.g., the G state in FIG. 10.

When the SGS transistor is turned on and a positive voltage Vcelsrc1, e.g., 1-2 V, is applied to the source end of the NAND string, such as at the substrate, the channel voltage will be equal to Vcelsrc1 for the channel regions adjacent to SGS to WLn−1 (plot 1101). When the SGD transistor is turned on and a positive voltage Vbl, e.g., 1-2 V, is applied to the drain end of the NAND string, at the bit line, the channel voltage will be equal to Vbl+Vcelsrc1 for the channel regions adjacent to WLn+1 to SGD (plot 1103). A relatively small channel gradient (plot 1102) is created in the channel region adjacent to WLn. This channel gradient is not likely to cause a disturb in this part of the pre-charge phase of a read operation, when the SGD and SGS transistors are turned on.

FIG. 11B depicts examples of channel voltages in the unselected NAND string of FIG. 11A in the pre-charge phase of the read operation, when the SGD and SGS transistors are turned off, resulting in a channel gradient which can disturb memory cells in the NAND string. The channel voltages correspond to the time t7 in FIG. 13A. The difference from FIG. 11A is that the memory cell of WLn is turned off due to 0 V, for example, applied to WLn, and the SGD transistor is turned off due to 0 V, for example, applied to the SGD line. The SGS transistor remains on and Vcelsrc1 continues on the source line so that the channel voltage will be continue to be equal to Vcelsrc1 for the channel regions adjacent to SGS to WLn−1 (plot 1101). However, since the memory cell of WLn and the SGD transistor are turned off, the channel region of WLn+1 to SGD is boosted to a level, Vboost (plot 1103a), which is higher than Vbl+Vcelsrc in FIG. 11A. The boosting is caused by a capacitive coupling between the unselected word lines and the channel, as the voltage signal of the unselected word lines increases to Vread at t5-t7 in FIG. 13A. In the example of FIG. 13A, the voltage signal of the unselected word lines increases from Vcutoff to Vread at t5-t7 while the memory cell of WLn and the SGD transistor are turned off.

FIG. 11B depicts two options for the voltage on WLn−1 and WLn+1. In a first option, VreadK is applied. This results in the channel gradients of plot 1103 between WLn−1 and WLn, and of plot 1102a between WLn and WLn+1. The larger channel gradient of plot 1102 is likely to disturb the memory cell of WLn+1 due to electron injection.

In a second option, which provides a read disturb countermeasure, Vread_low1 is applied to WLn−1 and WLn+1. Vread_low1 is lower than Vread or VreadK and is also lower than Vspike2 in FIG. 13A. This results in the channel gradients of plot 1103a between WLn−1 and WLn, and of plot 1102b between WLn and WLn+1. The channel gradient of plot 1102b is smaller than the channel gradient of plot 1102a (since the slope of the plot is lower) so that the risk of a disturb is advantageously reduced. In particular, Vch is at a level Vboost1 for a channel region adjacent to WLn+1 before increasing the Vboost at channel regions adjacent to WLn+2 to SGD.

The slope of the plot 1102b indicates the strength of an electric field which can generate electrons. With a reduced slope, the number of electrons is reduced. Additionally, with a reduced voltage applied to WLn+1, there is a reduced attraction of the electrons in the channel to the charge trapping layer. The risk of a disturb is therefore reduced for the memory cells connected to WLn+1. Generally, the timing and magnitude of the voltage signals can be optimized based on a tradeoff between read performance (e.g., read time) and read disturb (e.g., as measured by a number of read errors).

Similarly, the channel gradient of plot 1103a is smaller than the channel gradient of plot 1103 so that the risk of a disturb is again advantageously reduced for the memory cells connected to WLn−1.

FIG. 11C depicts another example of channel voltages in the unselected NAND string of FIG. 11A in the pre-charge phase of the read operation, when the SGD and SGS transistors are turned off, resulting in a channel gradient which can disturb memory cells in the NAND string. The channel voltages correspond to the time t7 in FIG. 13A. The difference from FIG. 11B is that WLn−2 and WLn+2 include the option for a voltage of Vread_low2 instead of Vread or VreadK. Vread_low2 is greater than Vread_low1, and lower than Vread, VreadK or Vspike2 in FIG. 13A. In a first option, Vread is applied to WLn−2 and WLn+2. This results in the channel gradients of plot 1103 between WLn−1 and WLn, and of plot 1102a between WLn and WLn+1, as discussed in connection with FIG. 11B.

In a second option, which provides a read disturb countermeasure, Vread_low2 is applied to WLn−2 and WLn+2 while Vread_low1 is applied to WLn−1 and WLn+1. This results in the channel gradients of plot 1103b between WLn−2 and WLn, and of plot 1102c between WLn and WLn+2. The risk of a disturb is advantageously reduced for the memory cells of both WLn+1 and WLn+2. In particular, Vch is at a level Vboost1 for a channel region adjacent to WLn+1 and at a level Vboost2 for a channel region adjacent to WLn+2, before increasing to Vboost at channel regions adjacent to WLn+3 to SGD.

The risk of read disturb is typically greater for the memory cells on the drain-side of WLn than on the source-side of WLn due to the turn off of the SGD transistor. Moreover, on the drain-side of WLn, the risk of read disturb is progressively lower for memory cells which are progressively further from WLn. For example, the risk is highest for a memory cell of WLn+1, second highest for a memory cell of WLn+2 and so forth. Accordingly, a read disturb countermeasure can be implemented with a strength which is in proportion to the risk of read disturb, where a higher strength corresponds to a lower voltage, Vread_low. When the voltage on WLn+1, for example, is set to Vread_low1 from t5-t7 in FIG. 13A, a capacitive coupling is avoided for the associated channel region, because the voltage does not increase after the SGD transistor is turned off. The read disturb countermeasures depicted in FIGS. 11B and 11C can be understood further in view of the flowcharts discussed further below.

The NAND string in FIG. 11A to 11C is an unselected NAND string in a read operation which involves a selected NAND string. For example, in FIG. 8, assume the NAND strings in SB0 are selected NAND strings in a selected sub-block, and the NAND strings in SB1-SB3 are unselected NAND strings in unselected sub-blocks. Further, assume the NAND string in FIG. 11A to 11C is the unselected NAND string 710n in SB1, and that the NAND string 700n in SB0 is an example of a selected NAND string.

The unselected NAND string 710n includes memory cells 725-729 connected to WLn−2 to WLn+2, respectively. The memory cell 727 is an unselected memory cell connected to the selected word line WLn. The memory cell 728 is a drain-side adjacent memory cell of the unselected memory cell 727, and WLn+1 is a drain-side adjacent word line of WLn. The memory cell 729 is an additional drain-side non-adjacent memory cell of the unselected memory cell 727, and WLn+2 is an additional drain-side non-adjacent word line of WLn. Similarly, the memory cell 726 is a source-side adjacent memory cell of the unselected memory cell 727, and WLn−1 is a source-side adjacent word line of WLn. The memory cell 725 is an additional source-side non-adjacent memory cell of the unselected memory cell 727, and WLn−2 is an additional source-side non-adjacent word line of WLn.

WLn+1 and WLn−1 are adjacent word lines of WLn, and WL0 to WLn−2 and WLn+2 to WL95 are non-adjacent word lines of WLn. WL0 to WLn−2 are source-side non-adjacent word lines of WLn, and WLn+2 to WL95 are drain-side non-adjacent word lines of WLn. Similarly, the memory cells connected to WLn+1 and WLn−1 are adjacent memory cells of the memory cells connected to WLn, and the memory cells connected to WL0 to WLn−2 and WLn+2 to WL95 are non-adjacent memory cells of the memory cells connected to WLn.

In the unselected NAND string 710n, the memory cell 728 is most susceptible to read disturb, and the memory cell 729 is second most susceptible to read disturb, consistent with FIGS. 11B and 11C. Similarly, in the other unselected NAND strings 710n1 and 710n2 of SB1, the memory cells connected to WLn+1 are most susceptible to read disturb. The above discussion regarding the unselected NAND strings in SB1 applies also to the unselected NAND strings in SB2 and SB3, which are also susceptible to read disturb.

During the read operation, the selected memory cell 707 in the selected NAND string 700n is read. The memory cells in the other selected NAND strings of SB0, such as the NAND strings 700n1 and 700n2, can also be read at the same time.

FIG. 12A depicts a flowchart showing an overview of example process for reducing disturbs in a read operation, consistent with FIGS. 11B and 11C. Step 1200 begins a read operation for selected memory cells in selected NAND strings in a set of NAND strings. For example, the selected NAND strings can be in a selected sub-block, and the set of NAND strings can be in a block. The selected memory cells can be connected to a selected word line. Step 1201 performs a pre-charge phase which reduces a likelihood of read disturb for unselected memory cells in unselected NAND strings in the set of NAND strings. For example, the unselected NAND strings can be in an unselected sub-block. FIG. 13A at t0-t9 provides an example of voltage signals in a pre-charge phase. Step 1202 performs a sensing phase which senses the selected memory cells relative to a read voltage. For example, the read voltage can be connected to the selected word line. FIG. 13A at t9-t15 provides an example of voltage signals in a sensing phase.

A decision step 1203 determines whether there is a next read voltage to apply in the sensing phase. If the decision step is true, the next read voltage is applied in step 1202. If the decision step is false, the read operation is done at step 1204.

Figure 12B:
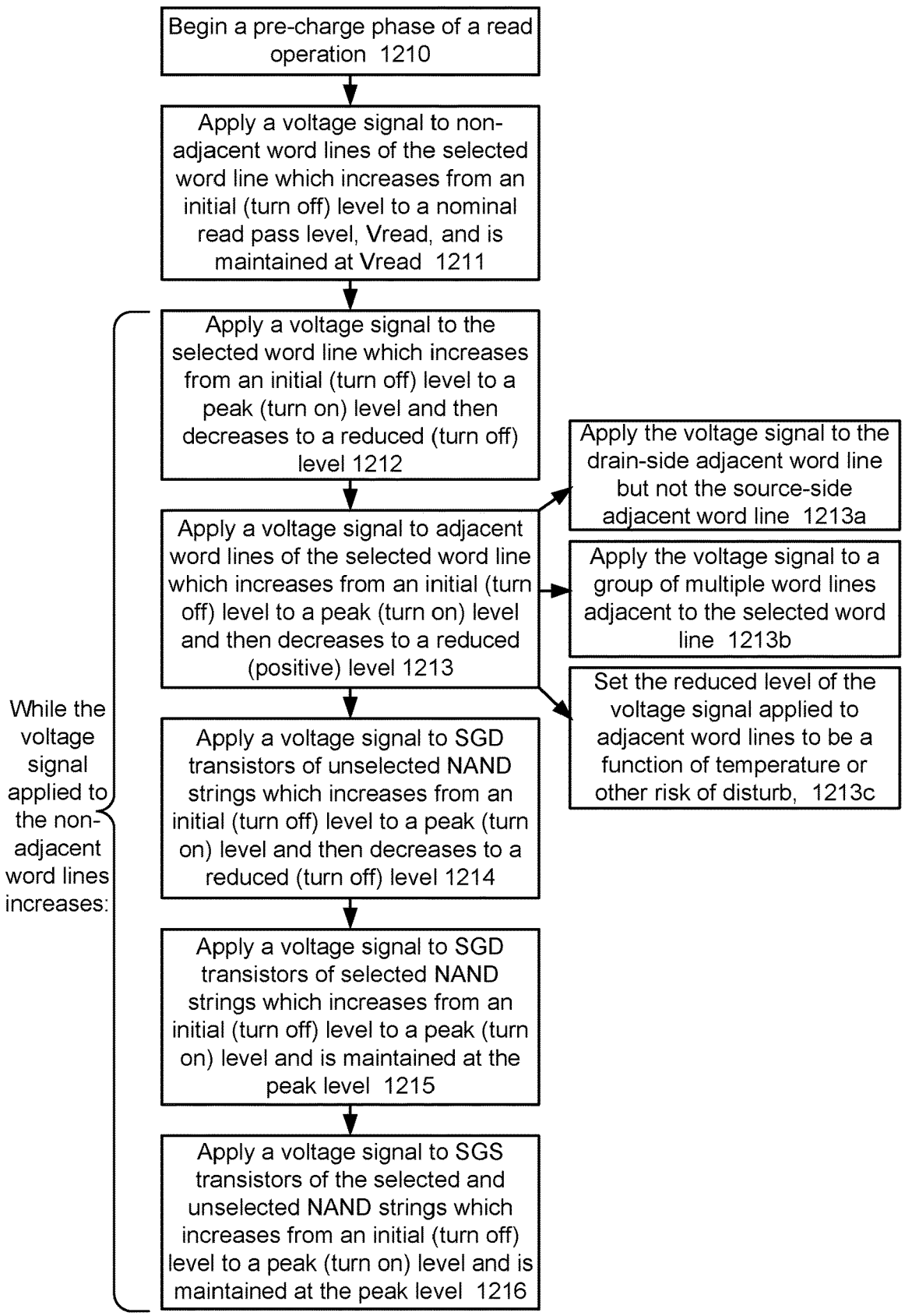
FIG. 12B depicts a flowchart showing example details of the pre-charge phase of step 1201 of FIG. 12A.

FIG. 12B depicts a flowchart showing example details of the pre-charge phase of step 1201 of FIG. 12A. Step 1210 begins a pre-charge phase of a read operation. Step 1211 includes applying a voltage signal to non-adjacent word lines of the selected word line which increases from an initial (turn off) level to a nominal read pass level, Vread, and is maintained at Vread. For example, see plots 1310 and 1311 in FIG. 13A at t0-t7, which depicts a voltage signal increasing from 0 V to Vread. Step 1212 includes applying a voltage signal to the selected word line which increases from an initial (turn off) level to a peak (turn on) level and then decreases to a reduced (turn off) level. For example, see plot 1301 in FIG. 13A, which depicts a voltage signal increasing increases from 0 V to Vspike1 at t0-t3 and then decreases from Vspike1 to 0 V at t3-t6. Additionally, the memory cell is conductive when the word line voltage exceeds an on/off level from t1-t5, and non-conductive from t0-t1 and t5-t6.

Step 1213 includes applying a voltage signal to adjacent word lines of the selected word line which increases from an initial (turn off) level to a peak (turn on) level and then decreases to a reduced (positive) level. For example, see plot 1310 in FIG. 13A at t0-t3, which increases from 0 V to Vspike2, and plot 1314 which increases decreasing from Vspike2 to Vread_low1. Step 1213 can be implemented with various options. For example, step 1213a includes applying the voltage signal to the drain-side adjacent word line (WLn+1) but not the source-side adjacent word line (WLn−1). Step 1213b includes applying the voltage signal to a group of multiple word lines (e.g., WLn+1 and WLn+2) adjacent to the selected word line. Step 1213c includes an option for setting the reduced level (Vread_low) of the voltage signal applied to the adjacent word lines to be a function of temperature or other risk of disturb. See also FIGS. 14A and 14B.

Step 1214 includes applying a voltage signal to the SGD transistors of the unselected NAND strings which increases from an initial (turn off) level to a peak (turn on) level and then decreases to a reduced (turn off) level. For example, see plot 1322 in FIG. 13A, which increases from 0 V to Vspike3 at t0-t3 and plot 1323 which decreases from Vspike3 to 0 V at t3-t6 for Vsgd_unsel. Additionally, the SGD transistor is conductive when the word line voltage exceeds an on/off level from t1-t5, and non-conductive from t0-t1 and t5-t6.

Step 1215 includes applying a voltage signal to the SGD transistors of the selected NAND strings which increases from an initial (turn off) level to a peak (turn on) level and is maintained at the peak level. For example, see plot 1322 in FIG. 13A for Vsgd_sel, which increases from 0 V to 6 V, for example, at t0-t4 and plot 1320 which is maintained at 6 V. The SGD transistor is conductive when the word line voltage exceeds the on/off level from t1-t14, and non-conductive from t0-t1.

Step 1216 includes applying a voltage signal to the SGS transistors of the selected and unselected NAND strings which increases from an initial (turn off) level to a peak (turn on) level and is maintained at the peak level. For example, see plot 1322 in FIG. 13A for Vsgs, which increases from 0 V to 6 V, for example, at t0-t4 and plot 1320 which is maintained at 6 V. The SGS transistor is conductive when the word line voltage exceeds the on/off level from t1-t14, and non-conductive from t0-t1.

Steps 1212 to 1216 can occur while the voltage signal applied to the non-adjacent word lines increases in step 1211.

Figure 12C:
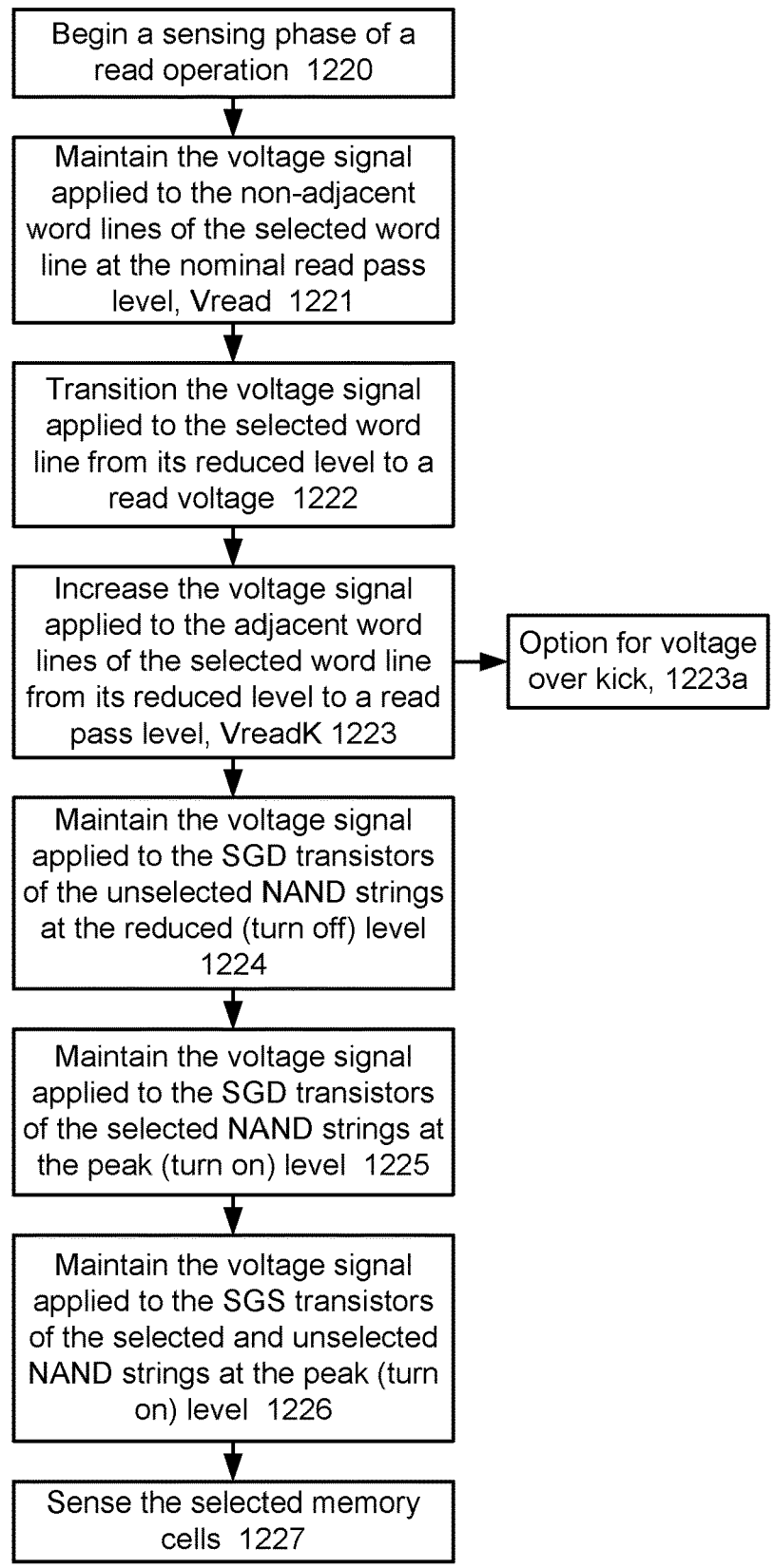
FIG. 12C depicts a flowchart showing example details of the sensing phase of step 1202 of FIG. 12A.
Figure 13B:
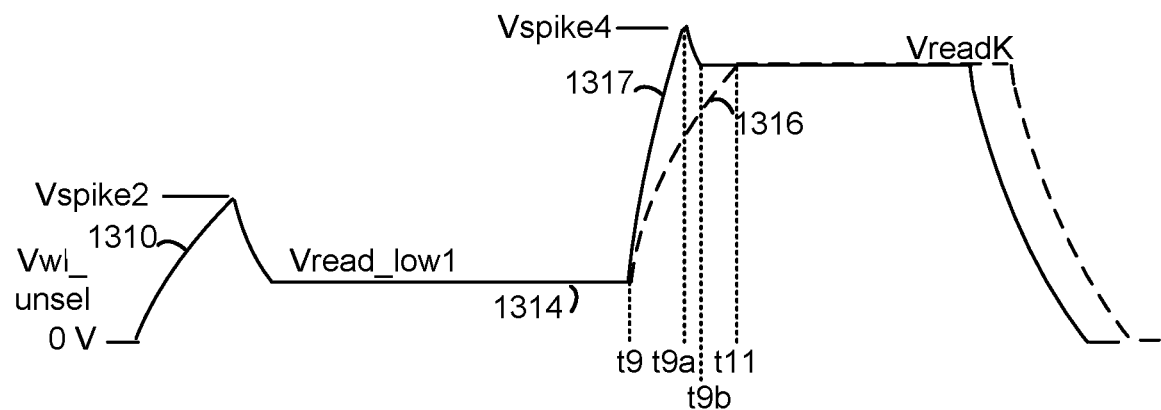

FIG. 12C depicts a flowchart showing example details of the sensing phase of step 1202 of FIG. 12A. Step 1220 begins a sensing phase of a read operation. Step 1221 includes maintaining the voltage signal applied to the non-adjacent word lines of the selected word line at the nominal read pass level, Vread. For example, see plots 1312 and 1313 at t9-t15. Step 1222 includes transitioning the voltage signal applied to the selected word line from its reduced level to a read voltage. For example, see plots 1302-1304 at t9-t15 which increase from 0 V to VrA and then to VrE. Step 1223 includes increasing the voltage signal applied to the adjacent word lines of the selected word line from its reduced level to a read pass level, VreadK. For example, see plots 1314 and 1316, where the voltage increases from Vread_low1 to VreadK. This step includes the option for a voltage over kick, such as depicted in FIG. 13B.

Step 1224 includes maintaining the voltage signal applied to the SGD transistors of the unselected NAND strings at the reduced (turn off) level. For example, see plot 1321, where the voltage is maintained at 0 V. Step 1225 includes maintaining the voltage signal applied to the SGD transistors of the selected NAND strings at the peak (turn on) level. For example, see plot 1320, where the voltage is maintained at 6 V. Step 1226 includes maintaining the voltage signal applied to the SGS transistors of the selected and unselected NAND strings at the peak (turn on) level. For example, see plot 1320, where the voltage is maintained at 6 V. Step 1227 includes sensing the selected memory cells.

FIG. 13A depicts example voltage signals in a read operation consistent with FIG. 12A to 12C. As mentioned, the pre-charge phase extends from t0-9 and the sensing phase extends from t9-t15. The plots 1301-1304 show how the voltage Vwl_sel spikes up from 0 V to a peak level, Vspike1, and then decreases to 0 V, for example, for the selected word line WLn. The voltage then increases to a first read voltage of VrA and then to a second read voltage VrE. These are example read voltages for reading a page of data. Sensing can occur between t12-t13 and t13-t4 when VrA and VrE, respectively, are applied. See also FIG. 2. The selected memory cell turns on at t1-t5.

The plots 1310-1316 are for unselected word lines. In particular, the plots 1310-1313 are for non-adjacent word lines of WLn. This could include WL0-WLn−1 and WLn+1-WL95, or WL0-WLn−2 and WLn+2-WL95, for example. The plots 1310, 1314 and 1316 are for an adjacent word line of WLn. This could include WLn−1 and WLn+1, for example. The voltage signal increases from 0 V to Vspike2 at t0-t3 and decreases from Vspike2 to Vread_low1 from t3-t5. The voltage signal then increases from Vread_low1 to VreadK from t9411. The plots 1310, 1315 and 1316 are for an additional non-adjacent word line of WLn. This could include WLn−2 and WLn+2, for example, which are two word lines away from WLn. The voltage signal increases from 0 V to Vspike2 at t0-t3 and decreases from Vspike2 to Vread_low2 from t3-t4. The voltage signal then increases from Vread_low2 to VreadK from t9411.

The plots 1322 and 1320 are for SGD transistors of selected NAND strings and for SGS transistors. The plots 1322, 1323 and 1321 are for SGD transistors of unselected NAND strings. The unselected SGD transistor turns on at t1-t5. The selected SGD transistor and the SGS transistor turn on at t1-t14.

Regarding the spike or peak voltages discussed, e.g., where the voltage signal reaches a level of Vspike1-Vspike3, this type of waveform can be obtained by a control circuit requesting a voltage driver to output a first voltage and then output a second, lower voltage before the first voltage is reached. For example, the control circuit 130 can make such requests to the voltage drivers via the interface 131. The control circuit can request that the voltage driver for Vwl_sel output a voltage greater than Vspike1 at t0-t3. For example, the voltage greater than Vspike1 could be Vread. The voltage driver takes some time to ramp up its output from 0 V to Vread. At t3, when the output voltage is Vspike1<Vread, such that the output voltage has not yet reached the requested level of Vread, control circuit can request that the voltage driver output a voltage lower than Vspike1, such as 0 V. A requested output is VrA at t12-t13, VrE at t13-t14 and 0 V at t14-t15.

As another example, a control circuit can request that the voltage driver for Vwl_unsel output a voltage greater than Vspike2 at t0-t3. For example, the voltage greater than Vspike2 could be Vread or VreadK. At t3, when the output voltage is Vspike2<Vread, such that the output voltage has not yet reached the requested level of VreadK, the control circuit can request that the voltage driver output a voltage lower than Vspike2, such as Vread_low1 (plot 1314) or Vread_low2 (plot 1315), from t3-t9. For plots 1314 and 1315, the requested output can be VreadK at t9-t14.

As another example, a control circuit can request that the voltage driver for Vsgd_unsel output a voltage greater than Vspike3 at t0-t3. For example, the voltage greater than Vspike3 could be 6 V, the peak voltage of Vsgd_sel and Vsgs. At t3, when the output voltage is Vspike3<6 V, the control circuit can request that the voltage driver output a voltage lower than Vspike3, such as 0 V. Vspike3 can be similar to, or less than Vspike1 and Vspike2. The spike voltages Vspike1-Vspike3 represent a peak voltage of a voltage signal at a time when the voltage driver is requested to reduce its output. The request to a voltage driver to change its output can be a step change request, in one approach. In one approach, the peak levels or spikes are reached concurrently, e.g., at t3, when the control circuit requests a step reduction in the output of the voltage drivers.

The plot 1330 is for Vbl, a bit line voltage. The voltage signal increases from 0 V to a first positive level, Vbl1, such as 1.3 V from t2-t4 and is maintained at the first level from t4-t8. The voltage signal then increases from Vbl1 to Vbl2, e.g., 1.5 V at t8 and is maintained at Vbl2 until t14. Vbl thus increases in two steps. Alternatively, Vbl could increase in a single step.

The plot 1340 is for Vcelsrc, a source line voltage. The voltage signal increases from 0 V to Vcelsrc1, such as 1.3 V from t2-t4 and is maintained at Vcelsrc1 from t4-t14. In one approach, the voltage signals for Vbl and Vcelsrc start to increase at the same time, e.g., at t2. Further, this start time can be after the start time, e.g., t0, in which the voltage signals of the word lines and select gate transistors start to increase from a respective initial level to a respective peak level. In other words, the start of the increase for Vbl and Vcelsrc can be delayed relative to the start of the increase for the voltage signals of the word lines and select gate transistors. By keeping Vcelsrc grounded from t0-t2, the memory cells will have a larger gate-to-source voltage which allows their voltage signals to ramp up faster. The increase in Vbl can be concurrent with the increase in Vcelsrc so that the drain and source ends, respectively, of the NAND string are concurrently biased at a positive voltage of Vbl1 and Vcelsrc1, respectively.

The read operation depicted in FIG. 13A involves applying multiple read voltages in turn to WLn, where the read voltages increase progressively. For example, VrA can be applied first followed by the higher voltage, VrE. Also in this example, Vwl_sel is set to a turn off level such as 0 V before increasing to VrA and then to VrE. Other options are possible.

Note also that when the voltage signal of the adjacent word lines increases from Vread_low1 to VreadK at t9-t11 in the sensing phase, this can generate a channel gradient which is similar to that shown in FIGS. 11B and 11C for the pre-charge phase. However, such a channel gradient in the sensing phase is expected to be smaller than during the pre-charge phase. One factor is the higher voltage on WLn (e.g., a read voltage such as VrA compared to 0 V). Another factor is that the non-adjacent word lines are fixed at Vread and are not being ramped up. Although, to reduce a potential channel gradient in the sensing phase, the adjacent word lines can be increased to Vread instead of the higher VreadK, for example, or even to a level below Vread. In another option, the read pass voltage can be lower on the drain-side adjacent word line than the source-side adjacent word line as the worse channel gradient may be on the drain-side. In any case, the read disturb countermeasure implemented during the pre-charge phase reduces the overall likelihood of read disturb.

FIG. 13B depicts an example voltage signal having a voltage over kick, consistent with FIG. 12C, step 1223a. A voltage over kick refers to a voltage signal which is intentionally driven higher than a target level, to provide a faster ramp up from an initial level to the target level. This technique can help save time to compensate for a potential increase in time due to the transition to Vread_low1 and Vread_low2 in a read disturb countermeasure. The voltage signal increases from 0 V to Vspike2, then decreases to Vread_low1, as in FIG. 13A. A comparison case involves the plot 1316 of FIG. 13A in which the voltage signal increases from Vread_low1 to VreadK at t9-t11 without an over kick. Plot 1317 shows the case with an over kick, where the voltage signal increases from Vread_low1 to Vspike4, at t9-t9a, then decreases from Vspike4 to VreadK at t9a-t9b. The voltage signal therefore reaches VreadK sooner by an amount t11-t9b. The time points t9 and t11 are consistent with FIG. 13A.

In one approach, a control circuit can request that the voltage driver for Vwl_unsel output a voltage greater than Vspike4 at t9-t9a. For example, the voltage greater than Vspike4 could be Vspike4+delta, where Vspike4>VreadK. At t9a, when the output voltage is Vspike4>VreadK, the control circuit can request that the voltage driver output VreadK.

FIG. 14A depicts a plot showing how Vread_low in FIG. 13A can vary with temperature, consistent with FIG. 12B, step 1213c. This can refer to Vread_low1 and/or Vread_low2, for example. Generally, the risk of read disturb is greater when the temperature is lower. That is, the risk of read disturb is a decreasing function of temperature. This is true because channel leakage is increased and channel boosting is therefore decreased at lower temperatures. In one approach, a read disturb countermeasure is made stronger when the risk of a disturb is higher. A stronger countermeasure can be implemented by using a lower Vread_low, for example. Accordingly, Vread_low can be lower when the temperature is lower and therefore when the risk of read disturb is greater. In other words, Vread_low can be relatively low when the temperature is relatively low and the risk of read disturb is relatively high.

FIG. 14B depicts a plot showing how Vread_low in FIG. 13A can vary with a risk of disturb, consistent with FIG. 12B, step 1213c. As mentioned, Vread_low can be lower when the risk of read disturb is greater. The risk of read disturb can be based on various factors which are present at the time of a read operation. One factor, as mentioned, is temperature. Another possible factor is the selected word line position in a stack. Testing of a memory device can reveal that the risk of read disturb is higher for certain positions of the selected word line. For example, a higher number of read errors can indicate a higher risk of read disturb. In a multi-tier stack such as in FIG. 7, the risk of read disturb can be higher when the selected word line is in one of the tiers, e.g., the bottom tier versus the top tier. Another possible factor is the selected sub-block position in a block, and the distance of the sub-block from the row decoder. For example, in FIG. 8, SB0 is closest to the row decoder and SB3 is furthest. Due to RC delays, the propagation time for a voltage signal can be longer when the distance is further. This can result in different levels of read disturb for different sub-blocks. Another possible factor is the time which has elapsed since the last read operation or other operation such as a program or erase operation.

Accordingly, it can be see that in one implementation, an apparatus comprises: a control circuit configured to connect to an unselected NAND string and a selected NAND string, the unselected NAND string comprising a plurality of memory cells between a drain-side select gate transistor and a source-side select gate transistor, the plurality of memory cells comprising an unselected memory cell connected to a selected word line, a drain-side adjacent memory cell of the unselected memory cell and non-adjacent memory cells of the unselected memory cell, the selected NAND string comprising a selected memory cell connected to the selected word line; and a memory interface connected to the control circuit, the control circuit is configured to issue a command via the memory interface to perform a pre-charge phase followed by a sensing phase in a read operation for the selected memory cell.

In the pre-charge phase, while a voltage signal applied to the non-adjacent memory cells increases from an initial level to a nominal read pass level (Vread), the control circuit is configured to: apply a voltage signal to the selected word line which increases from an initial level in which the unselected memory cell is turned off to a peak level in which the unselected memory cell is turned on and then decreases to a reduced level in which the unselected memory cell is turned off; apply a voltage signal to the drain-side select gate transistor which increases from an initial level in which the drain-side select gate transistor is turned off to a peak level in which the drain-side select gate transistor is turned on and then decreases to a reduced level in which the drain-side select gate transistor is turned off; and apply a voltage signal to the drain-side adjacent memory cell which increases from an initial level in which the drain-side adjacent memory cell is turned off to a peak level in which the drain-side adjacent memory cell is turned on and then decreases to a reduced level (Vread_low).

In the sensing phase, the control circuit is configured to maintain the voltage signal applied to the non-adjacent memory cells at the nominal read pass level, increase the voltage signal applied to the drain-side adjacent memory cell from its reduced level to a read pass level (VreadK), and apply a read voltage to the selected word line while sensing the selected memory cell.

In another implementation, a method comprises: boosting a channel of an unselected NAND string comprising a plurality of memory cells between a drain-side select gate transistor and a source-side select gate transistor, the plurality of memory cells comprising an unselected memory cell connected to a selected word line, a drain-side adjacent memory cell of the unselected memory cell and non-adjacent memory cells of the unselected memory cell. The boosting comprised: turning on and then off, the unselected memory cell and the drain-side select gate transistor, and turning on the source-side select gate transistor, while a voltage signal applied to the non-adjacent memory cells increases from an initial level to a read pass level (Vread) and a voltage signal applied to the drain-side adjacent memory cell increases from an initial level to a peak level and then decreases to a reduced level; and applying a positive bias to a source end and a drain end of the unselected NAND string while the unselected memory cell, the drain-side select gate transistor and the source-side select gate transistor are turned on. After the boosting of the channel, the method further comprises sensing a selected memory cell connected to the selected word line in a selected NAND string while the voltage signal applied to the non-adjacent memory cells is at its read pass level, the voltage signal applied to the drain-side adjacent memory cell is at a read pass level, and a read voltage is applied to the selected word line.

In another implementation, an apparatus comprises: a control circuit configured to connect to a set of memory cells, the set of memory cells are arranged in NAND strings and connected to a set of word lines, the NAND strings comprise NAND strings in a selected sub-block and NAND strings in an unselected sub-block, each NAND string comprises a drain-side select gate transistor at a drain end and a source-side select gate transistor at a source end, the set of word lines comprise a selected word line, a drain-side adjacent word line of the selected word line, and non-adjacent word lines of the selected word line.

The control circuit, to perform a read operation involving the selected word line, is configured to: increase a voltage signal applied to the non-adjacent word lines from an initial level to a read pass level (Vread); during the increasing of the voltage signal applied to the non-adjacent word lines, turn on and then turn off the drain-side select gate transistors of the NAND strings in the unselected sub-block, turn on without turning off the drain-side select gate transistors of the NAND strings in the selected sub-block, and increase a voltage signal applied to the drain-side adjacent word line from an initial level to a peak level and then decrease the voltage signal applied to the drain-side adjacent word line from the peak level to a reduced level; increase the voltage signal applied to the drain-side adjacent word line from the reduced level to a read pass level; and while the voltage signal applied to the non-adjacent word lines is at its read pass level, and the voltage signal applied to the drain-side adjacent word line is at its read pass level, apply a read voltage to the selected word line and sense memory cells connected to the selected word line in the selected sub-block.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a control circuit configured to connect to an unselected NAND string and a selected NAND string, the unselected NAND string comprising a plurality of memory cells between a drain-side select gate transistor and a source-side select gate transistor, the plurality of memory cells comprising an unselected memory cell connected to a selected word line, a drain-side adjacent memory cell of the unselected memory cell and non-adjacent memory cells of the unselected memory cell, the selected NAND string comprising a selected memory cell connected to the selected word line; and
   a memory interface connected to the control circuit, the control circuit is configured to issue a command via the memory interface to perform a pre-charge phase followed by a sensing phase in a read operation for the selected memory cell;
   in the pre-charge phase, while a voltage signal applied to the non-adjacent memory cells increases from an initial level to a nominal read pass level, the control circuit is configured to:
      apply a voltage signal to the selected word line which increases from an initial level in which the unselected memory cell is turned off to a peak level in which the unselected memory cell is turned on and then decreases to a reduced level in which the unselected memory cell is turned off;
      apply a voltage signal to the drain-side select gate transistor which increases from an initial level in which the drain-side select gate transistor is turned off to a peak level in which the drain-side select gate transistor is turned on and then decreases to a reduced level in which the drain-side select gate transistor is turned off; and
      apply a voltage signal to the drain-side adjacent memory cell which increases from an initial level in which the drain-side adjacent memory cell is turned off to a peak level in which the drain-side adjacent memory cell is turned on and then decreases to a reduced level; and
   in the sensing phase, the control circuit is configured to maintain the voltage signal applied to the non-adjacent memory cells at the nominal read pass level, increase the voltage signal applied to the drain-side adjacent memory cell from its reduced level to a read pass level, and apply a read voltage to the selected word line while sensing the selected memory cell.

2. The apparatus of claim 1, wherein:
the peak level of the voltage signal applied to the drain-side adjacent memory cell is less than the nominal read pass level.

3. The apparatus of claim 1, wherein:
in the sensing phase, the voltage signal applied to the drain-side adjacent memory cell increases from its reduced level to its read pass level using a voltage over kick.

4. The apparatus of claim 1, wherein:
the peak level of the voltage signal applied to the drain-side select gate transistor and the peak level of the voltage signal applied to the selected word line are reached concurrently.

5. The apparatus of claim 1, wherein:
the reduced level of the voltage signal applied to the drain-side adjacent memory cell is a positive voltage.

6. The apparatus of claim 1, wherein:
the read pass level of the voltage signal applied to the drain-side adjacent memory cell is greater than the nominal read pass level.

7. The apparatus of claim 1, wherein:
in the pre-charge phase, while the voltage signal applied to the non-adjacent memory cells increases from its initial level to the nominal read pass level, the control circuit is configured to apply a voltage signal to an additional drain-side memory cell of the unselected memory cell which increases from an initial level in which the additional drain-side memory cell is turned off to a peak level in which the additional drain-side memory cell is turned on and then decreases to a reduced level; and
the reduced level of the additional drain-side memory cell is greater than the reduced level of the drain-side adjacent memory cell.

8. The apparatus of claim 1, wherein:
the plurality of memory cells comprise a source-side adjacent memory cell of the unselected memory cell; and
in the pre-charge phase and the sensing phase, the voltage signal applied to the drain-side adjacent memory cell is also applied to the source-side adjacent memory cell.

9. The apparatus of claim 1, wherein:
the plurality of memory cells comprise drain-side non-adjacent memory cells and source-side non-adjacent memory cells of the unselected memory cell; and
in the pre-charge phase and the sensing phase, the voltage signal applied to the non-adjacent memory cells is applied to the drain-side non-adjacent memory cells and the source-side non-adjacent memory cells.

10. The apparatus of claim 1, wherein:
after starting the increase of the voltage signal applied to the non-adjacent memory cells, the control circuit is configured to start to increase a voltage applied to a drain end and a source end of the unselected NAND string.

11. The apparatus of claim 1, wherein:
the selected NAND string comprises a drain-side select gate transistor; and
in the pre-charge phase, while the voltage signal applied to the non-adjacent memory cells increases from its initial level to the nominal read pass level, the control circuit is configured to turn on and keep on the drain-side select gate transistor of the selected NAND string.

12. A method, comprising:
boosting a channel of an unselected NAND string comprising a plurality of memory cells between a drain-side select gate transistor and a source-side select gate transistor, the plurality of memory cells comprising an unselected memory cell connected to a selected word line, a drain-side adjacent memory cell of the unselected memory cell and non-adjacent memory cells of the unselected memory cell, the boosting comprising:
turning on and then off, the unselected memory cell and the drain-side select gate transistor, and turning on the source-side select gate transistor, while a voltage signal applied to the non-adjacent memory cells increases from an initial level to a read pass level and a voltage signal applied to the drain-side adjacent memory cell increases from an initial level to a peak level and then decreases to a reduced level; and
applying a positive bias to a source end and a drain end of the unselected NAND string while the unselected memory cell, the drain-side select gate transistor and the source-side select gate transistor are turned on; and
after the boosting of the channel, sensing a selected memory cell connected to the selected word line in a selected NAND string while the voltage signal applied to the non-adjacent memory cells is at its read pass level, the voltage signal applied to the drain-side adjacent memory cell is at a read pass level, and a read voltage is applied to the selected word line.

13. The method of claim 12, further comprising:
setting the reduced level of the drain-side adjacent memory cell as an increasing function of a temperature.

14. The method of claim 12, further comprising:
setting the reduced level of the drain-side adjacent memory cell as a decreasing function of a risk of read disturb on the unselected memory cell.

15. The method of claim 12, wherein:
a channel voltage of the unselected NAND string is coupled higher by the increasing of the voltage signal applied to the non-adjacent memory cells when the drain-side select gate transistor is turned off.

16. An apparatus, comprising:
a control circuit configured to connect to a set of memory cells, the set of memory cells are arranged in NAND strings and connected to a set of word lines, the NAND strings comprise NAND strings in a selected sub-block and NAND strings in an unselected sub-block, each NAND string comprises a drain-side select gate transistor at a drain end and a source-side select gate transistor at a source end, the set of word lines comprise a selected word line, a drain-side adjacent word line of the selected word line, and non-adjacent word lines of the selected word line, and the control circuit, to perform a read operation involving the selected word line, is configured to:
increase a voltage signal applied to the non-adjacent word lines from an initial level to a read pass level;
during the increasing of the voltage signal applied to the non-adjacent word lines, turn on and then turn off the drain-side select gate transistors of the NAND strings in the unselected sub-block, turn on without turning off the drain-side select gate transistors of the NAND strings in the selected sub-block, and increase a voltage signal applied to the drain-side adjacent word line from an initial level to a peak level and then decrease the voltage signal applied to the drain-side adjacent word line from the peak level to a reduced level;
increase the voltage signal applied to the drain-side adjacent word line from the reduced level to a read pass level; and
while the voltage signal applied to the non-adjacent word lines is at its read pass level, and the voltage signal applied to the drain-side adjacent word line is at its read pass level, apply a read voltage to the selected word line and sense memory cells connected to the selected word line in the selected sub-block.

17. The apparatus of claim 16, wherein:
the control circuit is configured to, during the increasing of the voltage signal applied to the non-adjacent word lines, turn on without turning off the source-side select gate transistors of the NAND strings in the unselected sub-block.

18. The apparatus of claim 17, wherein:
the control circuit is configured to, while the drain-side select gate transistors and the source-side select gate transistors in the unselected sub-block are turned on, applying a positive bias to the drain ends and the source ends of the NAND strings in the unselected sub-block.

19. The apparatus of claim 16, wherein:
channel voltages of the NAND strings in the unselected sub-block are coupled higher by the increasing of the voltage signal applied to the non-adjacent word lines when the drain-side select gate transistors of the NAND strings in the unselected sub-block are turned off.

20. The apparatus of claim 16, wherein:
drain-side adjacent memory cells connected to the drain-side adjacent word line in the unselected sub-block are turned on when the voltage signal applied to the drain-side adjacent word line is at the reduced level.

* * * * *